United States Patent [19]
Ohran et al.

[11] Patent Number: 5,978,565
[45] Date of Patent: Nov. 2, 1999

[54] METHOD FOR RAPID RECOVERY FROM A NETWORK FILE SERVER FAILURE INCLUDING METHOD FOR OPERATING CO-STANDBY SERVERS

[75] Inventors: Michael R. Ohran, Orem; Richard S. Ohran, Provo; David Green, Pleasant Grove; John M. Winger, Alpine, all of Utah

[73] Assignee: Vinca Corporation, Orem, Utah

[21] Appl. No.: 08/848,139

[22] Filed: Apr. 28, 1997

Related U.S. Application Data

[63] Continuation of application No. 08/441,157, May 15, 1995, abandoned, which is a continuation-in-part of application No. 08/094,755, Jul. 20, 1993, abandoned.

[51] Int. Cl.[6] .................................................. G06F 11/20
[52] U.S. Cl. ............................ 395/182.11; 395/182.04; 395/182.08
[58] Field of Search ........................ 395/181, 182.02, 395/182.04, 182.05, 182.08, 182.09, 182.11, 500

[56] References Cited

U.S. PATENT DOCUMENTS

| | | | |
|---|---|---|---|
| 5,157,663 | 10/1992 | Major et al. | 395/182.08 |
| 5,307,481 | 4/1994 | Shimazaki et al. | 395/182.09 |
| 5,408,649 | 4/1995 | Beshears et al. | 395/182.08 |
| 5,455,932 | 10/1995 | Major et al. | 711/162 |
| 5,488,716 | 1/1996 | Scheider et al. | 395/182.08 |
| 5,533,191 | 7/1996 | Nakano | 395/182.09 |
| 5,633,999 | 5/1997 | Clowes et al. | 395/182.04 |
| 5,666,479 | 9/1997 | Kashimoto et al. | 395/180 |

OTHER PUBLICATIONS

Steinberg, "Diverting Date From Disaster", Digital Review, V8, N35, Nov. 1991.

*Primary Examiner*—Meng-Al T. An
*Assistant Examiner*—Walter D. Davis, Jr.
*Attorney, Agent, or Firm*—Workman Nydegger & Seeley

[57] ABSTRACT

A method for providing rapid recovery from a network file server failure through the use of a backup computer system. The backup computer system runs a special mass storage access program that communicates with a mass storage emulator program on the network file server, making the disks (or other mass storage devices) on the backup computer system appear like they were disks on the file server computer. By mirroring data by writing to both the mass storage of the file server and through the mass storage emulator and mass storage access program to the disks on the backup computer, a copy of the data on the file server computer is made. Optionally, selected portions of the data read through the mass storage emulator program can be altered before being returned as the result of the read operation on the file server. In the event of failure of the file server computer, the backup computer can replace the file server, using the copy of the file server's data stored on its disks. A single backup computer can support a plurality of file server computers. Unlike other redundant file server configurations, this method does not require the backup computer system to be running the file server operating system.

25 Claims, 4 Drawing Sheets

METHOD FOR RAPID RECOVERY FROM A NETWORK FILE SERVER FAILURE INCLUDING METHOD FOR OPERATING CO-STANDBY SERVERS

CROSS-REFERENCES TO RELATED APPLICATIONS

This is a continuation of application Ser. No. 08/441,157, filed May 15, 1995, in the names of Richard S. Ohran, Michael R. Ohran, John M. Winger, and David Green for METHOD FOR RAPID RECOVERY FROM A NETWORK FILE SERVER FAILURE INCLUDING METHOD FOR OPERATING CO-STANDBY SERVERS, now abandoned, which is a continuation-in-part of application Ser. No. 08/094,755, filed Jul. 20, 1993, now abandoned in the names of Richard Ohran and Terry Dickson for METHOD FOR RAPID RECOVERY FROM A NETWORK FILE SERVER FAILURE, now abandoned.

BACKGROUND OF THE INVENTION

1. Field of the Invention

This invention relates to network file server computer systems, and in particular to the methods used to recover from a computer failure in a system with a plurality of computer systems, each with its own mass storage devices.

2. Description of Related Art

It is often desirable to provide continuous operation of computer systems, particularly file servers which support a number of user workstations or personal computers. To achieve this continuous operation, it is necessary for the computer system to be tolerant of software and hardware problems or faults. This is generally done by having redundant computers and mass storage devices, such that a backup computer or disk drive is immediately available to take over in the event of a fault.

A number of techniques for implementing a fault-tolerant computer system are described in Major et al., U.S. Pat. No. 5,157,663, and its cited references. In particular, the invention of Major provides a redundant network file server capable of recovering from the failure of either the computer or the mass storage device of one of the file servers. The file server operating system is run on each computer system in the network file server, with each computer system cooperating to produce the redundant network file server. This technique has been used by Novell to implement its SFT-III fault-tolerant file server product.

There are a number of reasons why the use of a redundant network file server such as described in Major may be undesirable. As can be seen from the description in Major, the software needed to provide such a redundant network file server is considerably more complex than the software of the present invention. This can result in a lower reliability due the increased presence of programming errors ("bugs") in the complex software. Also, the processing time required to handle a client request may be increased by the complexity of the redundant network file server software, when compared to a single-processor network file server. Finally, license restrictions or other limitations may make it infeasible or uneconomical to run a redundant network file server instead of a normal network file server.

SUMMARY OF THE INVENTION

It is an object of this invention to provide the rapid recovery from a network file server failure without the complex software of a redundant network file server. This is achieved by having a second, backup computer system with its own mass storage device (generally a magnetic disk). This backup computer is connected by an appropriate means for communications to the file server computer, allowing the transmission of information (such as commands and data) between the two computers. A mass storage emulator, running like a device driver on the file server computer, sends information to a mass storage access program on the backup computer. The mass storage access program performs the requested operation (read, write, etc.) on the mass storage system connected to the backup computer, and returns the result to the mass storage emulator on the file server computer.

This makes the mass storage device on the backup computer look like another mass storage device on the file server computer. The data mirroring option of the file server operating system can be activated (or, if the operating system does not support data mirroring, a special device driver that provides data mirroring can be used), so that a copy of all data written to the mass storage device directly connected to the file server will also be written to the mass storage device on the backup computer, through the mass storage emulator and mass storage access programs.

When a failure is detected in the file server computer system, the backup computer become the file server. The mass storage device of the backup computer will contain a copy of the information on the mass storage device of the failed file server, so the new file server can start with approximately the same data as when the previous file server failed.

It is a further object of this invention to allow a single backup computer to support a plurality of file server computers. This is achieved by having each file server computer run a mass storage emulator. The backup computer can run either a single mass storage access program capable of communicating with a plurality of mass storage emulators. Alternatively, if the operating system on the backup computer permits the running of multiple processes, the backup computer can run a separate mass storage access program for each mass storage emulator.

It is a further object of this invention to improve the reliability of a redundant network file server computer system by reducing the complexity of the software when compared to the software of a redundant network file server. The programs for the mass storage emulator on the file server computer and the mass storage access on the backup computer can be considerably less complex than a full redundant file server operating system.

Furthermore, while it is possible for the backup computer to be running the file server operating system (and acting as another file server), it is also possible to run the mass storage access program under a simple operating system or as a stand-alone program, reducing the complexity and increasing the performance of the backup computer system.

These and other features of the invention will be more readily understood upon consideration of the attached drawings and of the following detailed description of those drawings and the presently preferred embodiments of the invention.

DETAILED DESCRIPTION OF THE INVENTION

Figure 1:
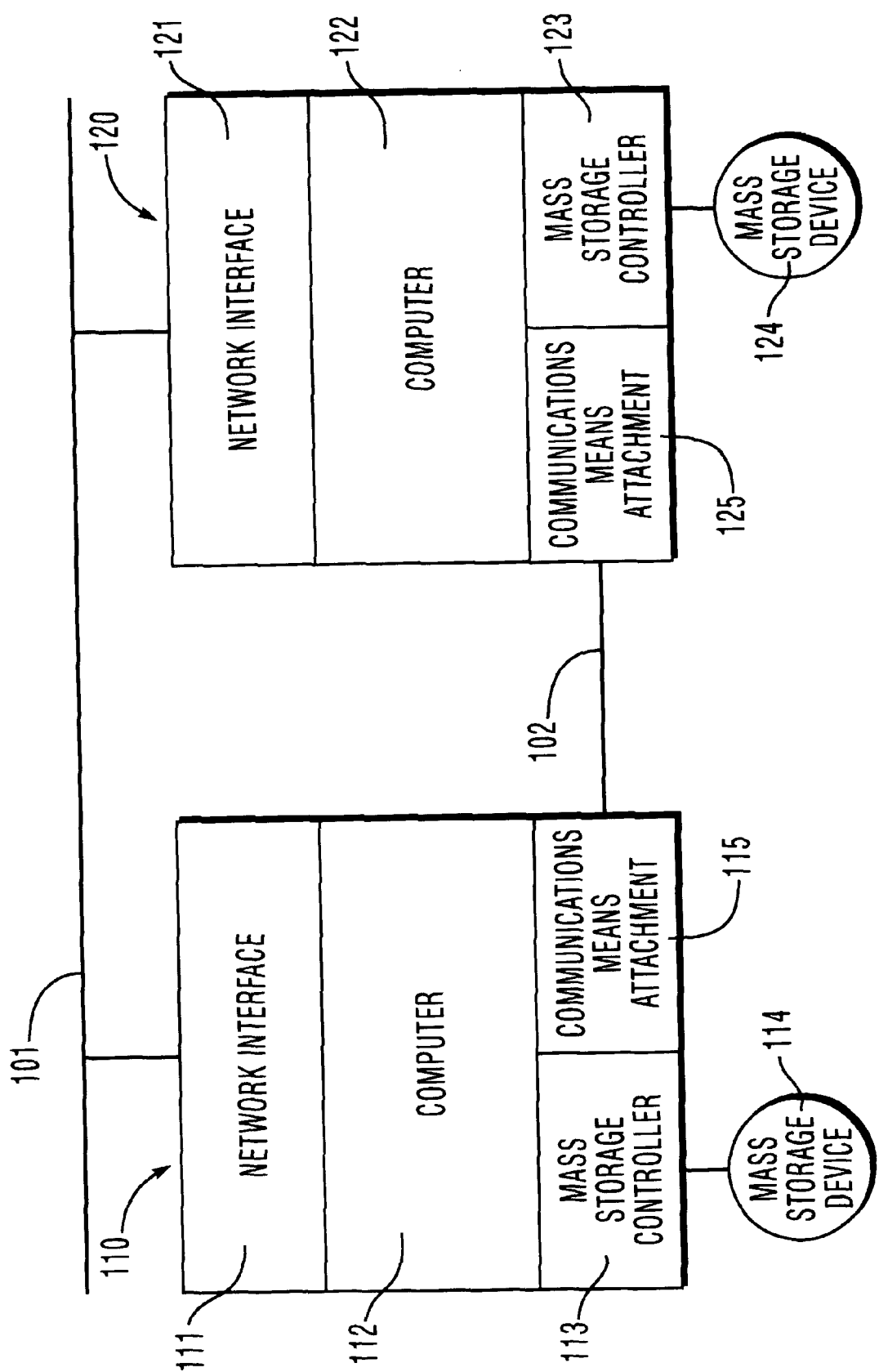
FIG. 1 illustrates a computer configuration on which the method of the invention runs.

Referring to FIG. 1, which illustrates a representative computer configuration on which the method of the invention runs, it can be seen that there are two computer systems 110 and 120. The first computer system 110 is running a file server operating system (such as Novell NetWare®). Computer system 110 includes computer 112 connected to network 101 through interface 111 (and its associated software), and mass storage device 114 connected through controller 113 (and its associated software). These represent the standard components of a network file server. In the case of NetWare, computer 112 may be a PC-compatible computer based on an Intel 486 or Pentium processor, network 101 can be an ethernet (so that interface 111 is an ethernet interface), and mass storage device 114 can be a SCSI or IDE magnetic disk connected through an appropriate controller 113. Computer 122 would also be a PC-compatible computer, so that it could also run the same NetWare file server operating system as computer 112. Network 101 could also be implemented as a token ring, Arcnet, or any other network technology.

The mass storage devices of the invention should not be viewed as limited to magnetic disk drives, but can also be implemented using optical discs, magnetic tape drives, or any other medium capable of handling the read and write requests of the particular computer system.

Added to the standard network file server to support the method of this invention are a backup computer system 120 and a means 102 for communicating between computer system 110 and computer system 120.

Computer system 120 has components similar to computer system 110. Computer system 120 can be connected to network 101 through interface 121, although it is not necessary for computer system 120 to actually be connected to network 101 during normal operation. Computer 122 is connected to interface 121 and to mass storage device 124 through controller 123.

While it is not necessary for computer system 120 to have identical components to computer system 110, in many cases that will be the case. In other cases, computer system 120 may be an older, slower system previously used as a file server but replaced with computer system 110. All that is required of computer system 120 is that it be capable of running the file server operating system in case of the failure of computer system 110, and that its mass storage device 124 be of sufficient capacity to hold the data mirrored from mass storage device 114.

Communications means 102 provides a link between computer systems 110 and 120. Computer 112 is connected to communications means 102 through attachment 115, and computer 122 is connected to communications means 102 through attachment 125. Communications means 102 can be implemented using a variety of techniques, well-known to those skilled in the art. In the preferred embodiments, a high-speed serial point-to-point link is used. An alternative would be to use the serial communications ports of computers 112 and 122, programmed to run at a high data rate, or the parallel interfaces of computers 112 and 122. Another alternative is for communications means 102 to be a virtual circuit or channel carried on network 101. In this latter case, communications means 102 would really be network 101, attachment 115 would really be interface 111, and attachment 125 would really be interface 121.

It is important that communication means 102 provide data transfer at rates comparable to the data rate of mass storage device 124 so that it does not limit the performance of the system. The method of this invention is not dependent on the particular implementation of communications means 102, although a communications means 102 dedicated only to the method of this invention will generally result in more efficient operation and simpler programs.

Figure 2:
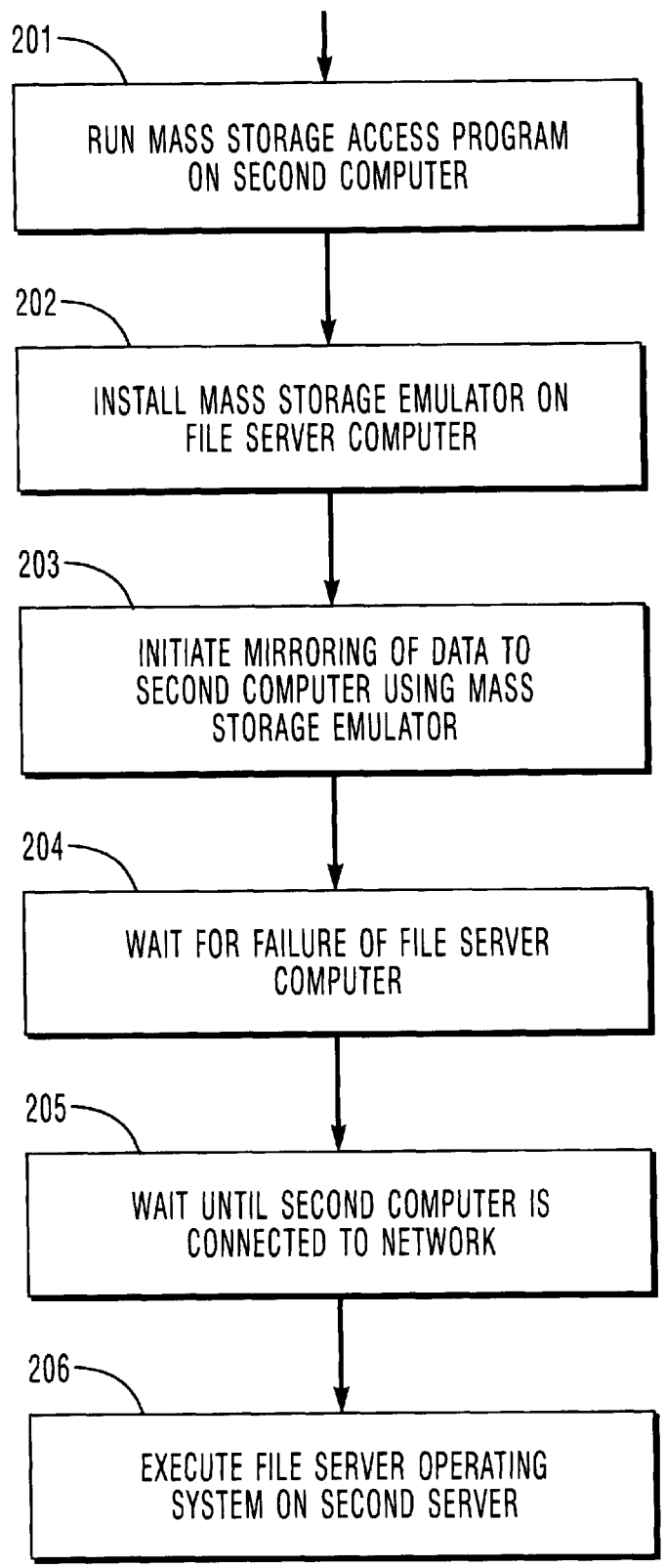
FIG. 2 is a flow diagram showing the steps of one preferred embodiment of the method of the invention.

FIG. 2 is a flow diagram showing the steps of the method of the invention. In step 201, a special program, the mass storage access program, is run on computer system 120. The mass storage access program receives commands from computer system 110 over communications means 102. Based on those commands, the mass storage access program accesses mass storage device 124 to perform the operation specified in the command received from computer system 110. The results of the accessing of mass storage device 124 is returned to computer system 110 over communications means 102.

The mass storage access program can be enhanced to provide a cache of data on mass storage device 124. The implementation of such a cache function is well-known in the art, consisting of keeping a copy of the most recently accessed information of mass storage device 124 in the memory of computer 122. When a read command is received, it is not necessary to access mass storage device 124 if a copy of the data is in the cache. Since computer 122 has a large memory (it must be large enough to run the file server operating system) and the mass storage access program is quite small, there is a large amount of memory available for the cache, particularly if computer 122 is only running the mass storage access program. This means that many entries will be in the cache, and the chance of finding a block being read in the cache is higher than would be normal for a similar cache in a file server operating system.

In step 202, coincidentally with the running of the mass storage access program on computer system 120, another program, the mass storage emulator, is installed on computer system 110. The mass storage emulator takes mass storage requests from the file server operating system running on computer system 110 and sends them as commands over communications means 102 to computer system 120, where they are processed by the mass storage access program, as discussed above.

When results from a command are received from the mass storage access program over communications means 102 by the mass storage emulator, they are returned to the file server operating system, much as the result of a normal mass storage request would be returned. In this way, the mass storage access program and the mass storage emulator cooperate to make it appear to the file server operating system that mass storage device 124 is directly connected to computer 112 on computer system 110.

In most cases, the results returned from a read operation will be the data stored at the specified mass storage location. However, in some embodiments of the invention it will be desirable to return an alternative value for special mass storage locations. For example, the first block on many mass storage systems contains information such as volume names. It may be necessary to avoid duplicate volume names, so alternative data for the first block, containing a non-duplicate volume name, will be returned by the mass storage access program for a read of the first block.

The alternative data could be stored as part of the mass storage access program, stored in a special location on the mass storage device accessed by the mass storage access program, or stored on another mass storage device. It can also be generated by the mass storage access program from the data stored in the special location, such as modifying a particular field. In any case, when one of the special locations is read, the mass storage access program transfers the alternative data to the mass storage emulator.

In one embodiment of this invention, the mass storage access program is a conventional program running under the disk operating system of personal computer 122. The disk storage emulator is a NetWare Loadable Module (NLM), much like the device driver for a disk drive. Copies of the source code for the mass storage access program and the mass storage emulator are given in the microfiche appendix.

In another embodiment of this invention, both computer systems 110 and 120 are running copies of the file server operating system. Computer system 120 can function as a file server while acting as a backup for computer system 110. The mass storage access program running on computer system 120 can be either a regular user program or a NetWare Loadable Module.

Figure 3:
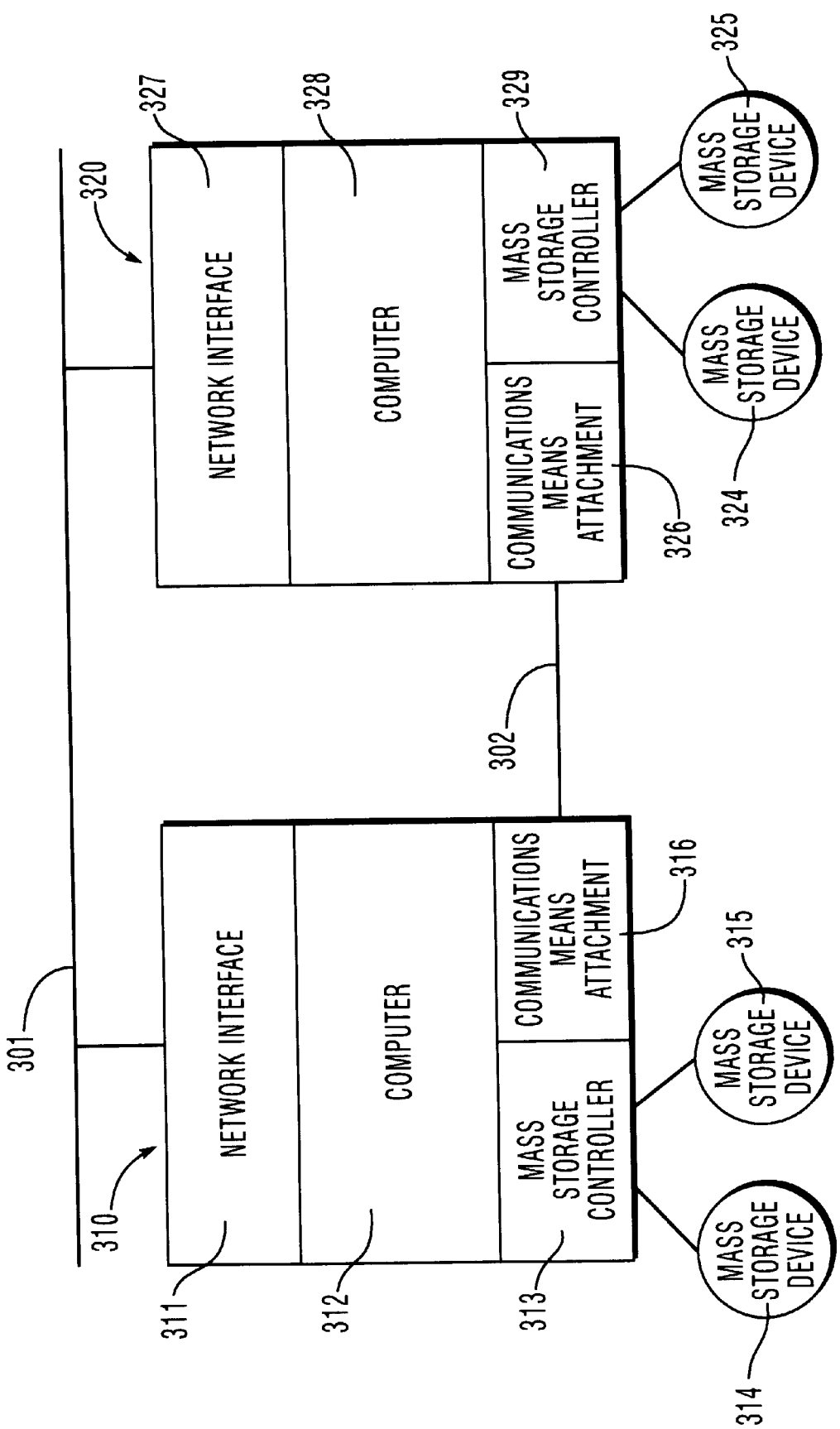
FIG. 3 illustrates a computer configuration with two file server computers.

In yet another embodiment of this invention, illustrated in FIG. 3, both computer systems 310 and 320 are running copies of the file server operating system, and each is acting as a backup for the other. Computer system 310 is running a mass storage emulator allowing it to access mass storage device 324 on computer system 320 by communicating with the mass storage access program running on computer system 320. Likewise, computer system 320 including computer 328 and network interface 327 is running a mass storage emulator 329 allowing it to access mass storage device 314 on computer system 310 by communicating with the mass storage access program running on computer system 310. Each file server is acting as a backup for the other using the present invention. Thus, if either file server goes down, the other can continue to serve the needs of the computer network without down time. And when neither file server is down, the users enjoy the benefits of fully utilizing the resources of their redundant file server capability. This is advantageous in comparison to utilizing a single dedicated backup file server which provides no services for users until the primary file server becomes unavailable.

If both computer systems 310 and 320 are running the file server operating system, there may be difficulties if the file server operating system uses special names in the labels of the disks. As illustrated in FIG. 3, file server 310 has mass storage devices 314 and 315, and file server 320 has mass storage devices 324 and 325. Mass storage devices 314 and 324 are the normal system disks on computer systems 310 and 320, respectively, and mass storage devices 315 and 325 are used to backup the other file server.

Often, an operating system such as NetWare will use a special disk label such as SYS for its main system disk. In the system of FIG. 3, mass storage devices 314 and 324, the normal system disks, will have the label SYS. However, because mass storage device 325 is a mirror of mass storage device 314, mass storage device 325 would normally also have the label SYS. Similarly, mass storage device 315 the mirror of mass storage device 324, would also have the label SYS. With many operating systems, such duplicate labels would cause difficulties.

This problem can be overcome by altering the mass storage access programs running on computer systems 310 and 320 to return alternative data when a read operation is performed on certain mass storage locations. To handle the duplicate label problem, each mass storage access program is configured to return an alternative label whenever the mass storage location containing the label is read.

For example, mass storage device 315 might have a real label of SYS.LEE (indicating that it is a mirror copy of the SYS disk of file server LEE) but the mass storage access program on computer system 310 would be programmed to return a label of SYS to the mass storage emulator running on computer system 320 whenever the label location is read. This would mean that computer system 310 would see disks with different labels (SYS for mass storage device 314 and SYS.LEE for mass storage device 315). However, computer system 320 would see the label SYS on both mass storage device 324 and on mass storage device 315, the mirror for mass storage device 324. Similarly, the real label for mass storage device 325 might be SYS.DAN (mirror copy of disk SYS on server DAN) but a label of SYS would be seen by computer system 310.

Returning to FIG. 2, in step 203, mirroring of data is initiated. When data is being mirrored on two or more mass storage devices, whenever data is to be written it is written to all mass storage devices taking part in the mirroring, at the same location on each mass storage device. (The location may be relative to the start of the mass storage device, or to the start of a partition or contiguous portion of the mass storage device, as appropriate to the way the mass storage device has been formatted and is being used.) Data can be read from any mass storage device taking part in the mirroring, since each mass storage device contains identical data.

Mirroring may be an integral function of the file server operating system, so that no special program is necessary for implementing disk mirroring as part of the method of this invention. Step 203 only requires the activation or starting of mirroring on the part of the file server operating system. This is the case in the preferred embodiments of the invention, operating with NetWare and using the mirroring facilities of that file server operating system.

If the file server operating system does not provide mirroring, a separate mirroring module will have to be implemented. Such a mirroring module, whose implementation should be obvious to one skilled in the art, will take each write request and pass it to the driver for each mass storage device taking part in the mirroring. For mass storage device 124 on computer system 120, the driver will be the mass storage emulator, discussed above. When successful completion of the write request has been received from all mass storage devices taking part in the mirroring, the mirroring module will indicate successful completion to the file server operating system.

For read requests, the mirroring module can direct the read request to any of the mass storage devices, since all contain identical data. Generally, the read request will be directed to the mass storage device which is first available to handle the request.

As part of the initiating of mirroring, it is necessary to assure that each mass storage device taking part in mirroring has the same contents at the start of mirroring. This can be done by designating one of the mass storage devices as the master, and making a copy of the master mass storage device's data to all other mass storage devices taking part in the mirroring. An alternative approach is to have a timestamp indicating when the last change was made to the data on a mass storage device. If the timestamp on a mass storage device is the same as the timestamp on the master mass storage device, it will not be necessary to make a new copy of the data.

At step 204, the method of this invention waits until a failure of file server computer system 110 is detected. Such a failure could come from the failure of either hardware (such as computer 112 or mass storage device 114) or software (such as the file server operating system). Although means for automatically detecting such a failure may be used, such failure can also be detected by a system operator or workstation user noticing that file server requests are no longer being handled by computer system 110. It is not difficult for a user to determine there is a problem with file server computer system 110; in most cases, a user workstation will stop working and "hang" while it waits for a file server request that will never be honored.

In step 205, when a failure of computer system 110 has been detected, if computer system 120 is not currently connected to network 101 through interface 121, it is connected to network 121. This can be done either by activating interface 121 or physically connecting interface 121 to network 101, as appropriate.

In step 206, when computer system 120 has been connected to network 101, the file server operating system is loaded into computer 122 and executed if computer 122 is not already running the file server operating system, so that computer system 120 is a file server computer system. New file server computer system 120 now responds to requests received from network 101 as failed file server computer system 110 did before its failure. The file server operating system executing on computer 122 accesses mass storage device 124 to respond to the requests.

Note that because mass storage device 124 received data through the mass storage emulator and mass storage access program while file server computer system 110 was operating, mass storage device 124 contains a copy of the data stored on mass storage device 114 prior to the failure of computer system 120. (Because of timing, the last few write operations may not have occurred on all mass storage devices taking part in mirroring, but the file server operating system is capable of handling these small differences.) Because a copy of the mass storage data of failed file server computer system 110 is immediately available to new file server computer system 120, the time necessary to recover from a file server failure is minimal.

When the fault that caused the failure of computer system 120 has been corrected, fault-tolerant operation can be restored. Depending on the relative capabilities of computer systems 110 and 120, one of two techniques can be employed. Both involve the same method steps as were discussed above.

If the two computer systems have components of similar speed and capacity, there is no reason not to continue using computer system 120 as the file server computer. In this case, computer system 110 can now be treated as the backup computer system. The mass storage access program is run on computer system 110, the mass storage emulator is installed on computer system 120, and mirroring is initiated on the file server operating system running on computer system 120. As part of the initiating of mirroring, any data written to mass storage device 124 during the time computer system 110 was not available is now copied to mass storage device 114 though the mass storage emulator, communications mean 102, and the mass storage access program.

Alternatively, if computer system 120 is less capable than computer system 110, it will be desirable to make computer system 110 the file server computer system when the failure has been corrected. To accomplish this, two approaches are possible. In the first approach, computer system 110 is brought up as the backup computer system, running the mass storage access program, as discussed above. When mass storage device 114 contains a copy of the data on mass storage device 124, computer system 110 can be restarted as the file server (running the file server operating system) and computer system 120 can be restarted as the backup computer in accordance with the method discussed above.

The second approach is when the failure of computer system 110 has been corrected, computer system 120 is restarted as backup computer system, running the mass storage access program, and computer system 110 is restarted as the file server computer, running the file server operating system and the mass storage emulator. When mirroring is initiated, it will be determined by the timestamps stored on each of mass storage devices 114 and 124 that the data on mass storage device 114 is out of date. The file server operating system will read the data on mass storage device 124 (though the mass storage emulator, communications means 102, and the mass storage access program). It will also copy the data from mass storage device 124 to mass storage device 114 until they contain identical data.

Figure 4:
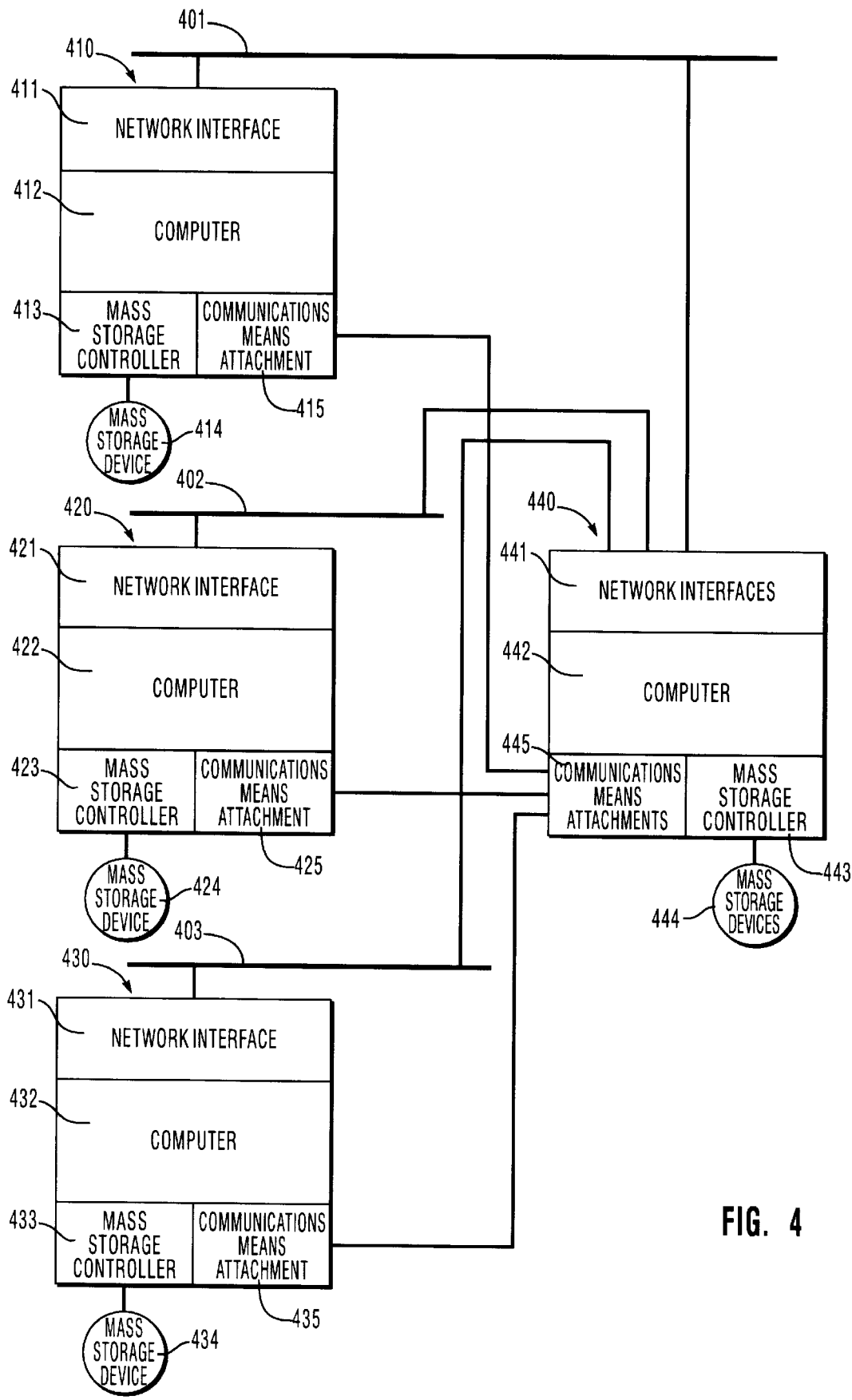
FIG. 4 illustrates a single backup computer supporting a plurality of file server computers.

It is possible for a single computer system to act as the backup for a plurality of file server computers, not just a single file server as was discussed above. FIG. 4 illustrates one possible configuration. It shows three file server computer systems 410, 420, and 430 serving networks 401, 402, and 403, respectively. They can communicate with backup computer system 440 through communications means attachments 415, 425, 435, and 445. Communications means attachments 445 can be a single device, or three identical devices interfaced to computer 442. Computer 442 can also be attached to networks 401, 402, or 403 through network interfaces 441. Network interfaces 441 could be a single device switchable to networks 401, 402, or 403, as required, a single device capable of connecting to three networks, or three separate devices.

Each file server computer 410, 420, and 430 runs a mass storage emulator as previously described. Backup computer 440 can run either a single mass storage access program capable of communicating with a plurality of mass storage emulators. Alternatively, if the operating system on the backup computer permits the running of multiple processes, the backup computer can run a separate mass storage access program for each mass storage emulator. Backup data is stored on mass storage devices 444, which must have a total capacity equal to the sum of the capacities of mass storage devices 414, 424, and 434 which are being mirrored. Mass storage device 444 can be implemented as a single, large storage device or a plurality of smaller storage devices.

When a failure of one of file server computers 410, 420, or 430 is detected, backup computer 440 takes on the role of the failed file server as described above. While acting as a file server, backup computer 440 can continue to act as a backup for the remaining file servers by continuing to run a mass storage access program.

Computer programs implementing the mass storage emulator and the mass storage access program will commonly be distributed to users on a computer-readable medium such as floppy disk or CD-ROM. From there, they will often be copied to a hard disk or a similar intermediate storage medium. When the mass storage emulators or mass storage access programs are to be run, they will be loaded either from their distribution medium or their intermediate storage medium into the execution memory of the computer, configuring the computer to act as a mass storage emulator or mass storage access program.

It is to be understood that the above described embodiments are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

Source Code

The attached appendix includes computer source code of one preferred embodiment of the invention.

APPENDIX to

**METHOD FOR RAPID RECOVERY FROM A NETWORK
FILE SERVER FAILURE INCLUDING METHOD
FOR OPERATING CO-STANDBY SERVERS**

MODULE STNDBSVR;

(* This module is the main DOS engine for the Standby Server Link. This module calls the Tlink
module for specific communication routines. This STNDBSVR module also communicates with the
Novell Netware Mass Storage Emulator DSK developed by Vinca Corporation *)

(* Import all necessary linked system modules from Modula II compiler*)
FROM SYSTEM IMPORT NEWPROCESS,TRANSFER,IOTRANSFER,ADDRESS,ADR,INB,OUTB,
            BYTE,INT,REGISTERS,FLAGS,ENABLE,DISABLE;
(* Import TLink for proprietary library routines*)
FROM TLink IMPORT CHANIN,CHANOUT,WORDIN,InitAdapter;
FROM RTSDevice IMPORT SetDeviceStatus,InstallHandler;
FROM Terminal IMPORT WriteString,WriteLn;
FROM InOut IMPORT WriteHex;

CONST linkport = 150H;
    inputdataport = linkport + 0;
    outputdataport = linkport + 1;
    inputstatusport = linkport + 2;
    outputstatusport = linkport + 3;
    iniordyport = linkport + 12H;
    outiordyport = linkport + 13H;

disableint = 0;
    enableint = 2;
    maxsectors = 8;

(* Link Adapter status port bit definitions *)
    intenablebit = 1;
    readybit = 0;

(* commandwords from Link *)
    resetscan = 1;
    nextscan = 2;
    read = 3;
    write = 4;

(* Disk Error Codes *)
    MediaError = 2;
    NonMediaError = 3;
    DriveNotActive = 4;

```
TYPE netwareCommand= RECORD (* netware command structure - 32 bytes *)
    Naddress:LONGCARD;
    diskhandle:LONGCARD;
    currentrequest:LONGCARD;
    currentioctl:LONGCARD;
    completioncode:CARDINAL;
    function:CARDINAL;
    disknum:CARDINAL;
    numsectors:CARDINAL;
    startingsector:LONGCARD;
    bufferaddress:LONGCARD;
END;

scanCommand= RECORD
    Saddress:LONGCARD;
    WaitFlag:BYTE;
    DriveNum:BYTE;
    NumSectors:BYTE;
    NumHeads:BYTE;
    NumCylinders:CARDINAL;
    DriveType:BYTE;
    NameLength:BYTE;
    name:ARRAY[0..59] OF CHAR;
END;

requestMessage= RECORD
    commandword:LONGCARD;
    CASE : BOOLEAN OF
    TRUE: cmdBlock:netwareCommand;
            body: ARRAY[0..4095] OF CHAR;
    | FALSE: BPB:scanCommand;
    END;
END;

VAR workspace:ARRAY[0..4095] OF CHAR;
    intthread,mainthread:ADDRESS;
    nextin,nextdo,nextout,lastdone:CARDINAL;
    elapsed,timeout:LONGCARD;
    instatus,outstatus,ch,numberofdrives:CHAR;
    inputstatus,intmask:BITSET;
    r:REGISTERS;
    bufcount,i:CARDINAL;
    scanstate:(reset,error);
    errorcode,scanindex:CARDINAL;
    code,errorindex:CARDINAL;
    errorlog:ARRAY[0..7] OF CARDINAL;

request:ARRAY[0..7] OF requestMessage;
    disk:ARRAY[1..10] OF RECORD
        sectors,heads,cylinders:CARDINAL;
        offset:LONGCARD;
        size:LONGCARD;
        volnum:CARDINAL;
```

```
    END;

PROCEDURE EHALT(errornum:CARDINAL);
BEGIN
 WriteLn;
 WriteString('Error routine called: ');
 WriteHex(errornum,2);
 errorindex:=(errorindex+1) MOD 8;
 errorlog[errorindex]:=errornum;
END EHALT;

PROCEDURE ErrorMap(errorvalue:CARDINAL):CARDINAL;
 VAR sugardaddy:BITSET;      (* Maps INT13 errors to Netware errors *)
BEGIN
 sugardaddy:=BITSET(errorvalue);
 IF   0  IN sugardaddy THEN RETURN(NonMediaError)
 ELSIF 1  IN sugardaddy THEN
  IF  2  IN sugardaddy THEN RETURN(NonMediaError)
  ELSE   RETURN(MediaError)
  END
(*ELSIF 1,0 IN sugardaddy THEN RETURN(NonMediaError) *) (* 0 handles *)
 ELSIF 2  IN sugardaddy THEN RETURN(MediaError)
(*ELSIF 2,1 IN sugardaddy THEN RETURN(NonMediaError) *) (* extra IF handles *)
 ELSIF 3  IN sugardaddy THEN RETURN(NonMediaError)
(*ELSIF 3,0 IN sugardaddy THEN RETURN(NonMediaError) *) (* 0 handles *)
(*ELSIF 3,2 IN sugardaddy THEN RETURN(MediaError)    *) (* 2 handles *)
 ELSIF 4  IN sugardaddy THEN RETURN(MediaError)
 ELSIF 5  IN sugardaddy THEN RETURN(NonMediaError)
 ELSIF 6  IN sugardaddy THEN RETURN(NonMediaError)
 ELSIF 7  IN sugardaddy THEN RETURN(DriveNotActive)
 ELSE   RETURN(NonMediaError)
 END;

(*
  CASE BITSET(errorvalue) OF          (* From BIOS.10 table       *)
  {0}:   RETURN(NonMediaError);        (* Illegal command to driver *)
 |{1}:   RETURN(MediaError);           (* Bad Sector              *)
 |{1,0}: RETURN(NonMediaError);        (* Write-protected disk    *)
 |{2}:   RETURN(MediaError);         (* Sector not found          *)
 |{2,1}: RETURN(NonMediaError);        (* diskette change line active *)
 |{3}:   RETURN(NonMediaError);        (* DMA overrun             *)
 |{3,0}: RETURN(NonMediaError);        (* DMA attempt across 64K boundary *)
 |{3,2}: RETURN(MediaError);          (* Invalid media            *)
 |{4}:   RETURN(MediaError);         (* CRC error on disk read    *)
 |{5}:   RETURN(NonMediaError);        (* Controller error        *)
 |{6}:   RETURN(NonMediaError);        (* Seek failure            *)
 |{7}:   RETURN(DriveNotActive);       (* Disk time out, no response, not ready *)
  ELSE
   RETURN(NonMediaError)
  END; (* case *)
*)

END ErrorMap;
```

```
PROCEDURE ReadSector(drive:CARDINAL;numsector:CARDINAL;firstsector:LONGCARD;
                    bufad:ADDRESS;VAR error:CARDINAL);
VAR sectorspercylinder,cylinder,headandsector,head,sector:CARDINAL;
BEGIN
  sectorspercylinder:=(disk[drive].heads*disk[drive].sectors);
  cylinder:=ORD(firstsector DIV LONGORD(sectorspercylinder));
  headandsector:= ORD(firstsector -
                  LONGORD(cylinder)*LONGORD(sectorspercylinder));
  head:=headandsector DIV disk[drive].sectors;
  sector:= (headandsector - head*disk[drive].sectors)+1;
  r.AH:=02H;
  r.AL:=CHAR(numsector);
  r.ES:=bufad.SEGMENT;
  r.BX:=bufad.OFFSET;
  r.CH:=CHAR(cylinder MOD 256);
  r.CL:=CHAR(cylinder DIV 256 *64 + sector);
  r.DH:=CHAR(head);
  r.DL:=CHAR(disk[drive].volnum);
  INT(13H,r);            (* send read command to drive *)
  IF CarryFlag IN r.FLAGSET THEN error:=ORD(r.AH)
  ELSE error:=0
  END;
END ReadSector;

PROCEDURE WriteSector(drive:CARDINAL;numsector:CARDINAL;firstsector:LONGCARD;
                     bufad:ADDRESS;VAR error:CARDINAL);
VAR sectorspercylinder,cylinder,headandsector,head,sector:CARDINAL;
BEGIN
  sectorspercylinder:=(disk[drive].heads*disk[drive].sectors);
  cylinder:=ORD(firstsector DIV LONGORD(sectorspercylinder));
  headandsector:= ORD(firstsector -
                  LONGORD(cylinder)*LONGORD(sectorspercylinder));
  head:=headandsector DIV disk[drive].sectors;
  sector:= (headandsector - head*disk[drive].sectors)+1;
  r.AH:=03H;
  r.AL:=CHAR(numsector);
  r.ES:=bufad.SEGMENT;
  r.BX:=bufad.OFFSET;
  r.CH:=CHAR(cylinder MOD 256);
  r.CL:=CHAR(cylinder DIV 256 *64 + sector);
  r.DH:=CHAR(head);
  r.DL:=CHAR(disk[drive].volnum);
  INT(13H,r);            (* send write command to drive *)
  IF CarryFlag IN r.FLAGSET THEN error:=ORD(r.AH)
  ELSE error:=0
  END;
END WriteSector;

PROCEDURE DoCommand(buffer:CARDINAL);   (* lastdone *)
BEGIN code:=ORD(request[buffer].commandword DIV 256 MOD 256);
```

```
CASE code OF
resetscan: (* reset scan *)
  scanstate:=reset;
  scanindex:=1; (*reset the scan for devices*)

| nextscan: (* scan the drive *)
  IF scanstate=reset THEN
  WITH request[buffer] DO
    r.AH:=8;
    r.DL:=CHAR(scanindex-1+80H);
    INT(13H,r);         (* send scan command to drive *)
    IF (scanindex = 1) THEN
        numberofdrives:=r.DL;
    END;
(*    IF CarryFlag IN r.FLAGSET THEN *)
    IF (scanindex > ORD(numberofdrives)) THEN
        BPB.WaitFlag:=0C;
        BPB.DriveNum:=0C;
        BPB.NumSectors:=0;
        BPB.NumHeads:=0;
        BPB.NumCylinders:=0;
        BPB.DriveType:=0c;
        BPB.NameLength:=0;
        BPB.name:="zzzzzzzz12345678  ";
        commandword:=002002A5H;
(*      commandword:=0A5H + 200H + LONG(SIZE(scanCommand))*10000H; *)
        scanstate:=error;
    ELSE
        BPB.DriveNum:=CHAR(scanindex);
        BPB.WaitFlag:=0c;
        BPB.NumSectors:=CHAR(ORD(r.CL)MOD 64);
        disk[scanindex].sectors:=ORD(r.CL)MOD 64;
        BPB.NumHeads:=CHAR(ORD(r.DH)+1);
        disk[scanindex].heads:=ORD(r.DH)+1;
        BPB.NumCylinders:=ORD(r.CH)+(ORD(r.CL) DIV 64 * 256)+1;
        disk[scanindex].cylinders:=BPB.NumCylinders;
        BPB.DriveType:=0C;
        BPB.NameLength:=8;
        IF scanindex=1 THEN BPB.name:='DRIVE0 '
        ELSIF scanindex=2 THEN BPB.name:='DRIVE1 '
        END;
        disk[scanindex].offset:=0;
        disk[scanindex].volnum:=scanindex-1+80H;
        FOR i:=0 TO 7 DO
            IF BPB.name[i]=0C THEN BPB.name[i]:=' ' END;
        END;
        commandword:=002002A5H;   (* SIZE(scanCommand)<>20H *)
(*      commandword:=0A5H + 200H + LONG(SIZE(scanCommand))*10000H; *)
    END;
    INC(scanindex);
    END; (* with *)
    END;

| read: (*read command*)
```

```
WITH request[buffer].cmdBlock DO

IF disknum > maxdisk THEN EHALT(3) END;
    IF (numsectors > maxsectors) THEN EHALT(4) END;
    maximumsector:=(disk[disknum].sectors * disk[disknum].heads
                                            * disk[disknum].cylinders);
    IF (startingsector > maximumsector) THEN EHALT(5); END;
    bufcount:=ORD(numsectors * 512);

ReadSector(disknum,numsectors,startingsector,
                    ADR(request[buffer].body),errorcode);
    IF errorcode <> 0 THEN
        EHALT(34);
        completioncode:=ErrorMap(errorcode)
    ELSE
        completioncode:=0
    END;

request[buffer].commandword:=0A5H + 300H +
                        LONG(SIZE(netwareCommand) + bufcount)*10000H;
    END; (* with *)

| write: (*write request*)
    WITH request[buffer].cmdBlock DO

IF disknum > maxdisk THEN EHALT(6) END;
    IF (numsectors > maxsectors) THEN EHALT(8) END;
    maximumsector:=(disk[disknum].sectors * disk[disknum].heads
                                            * disk[disknum].cylinders);
    IF (startingsector > maximumsector) THEN EHALT(7); END;

WriteSector(disknum,numsectors,startingsector,
                    ADR(request[buffer].body),errorcode);
    IF errorcode <> 0 THEN
        EHALT(25);
        completioncode:=ErrorMap(errorcode)
    ELSE
        completioncode:=0
    END;

request[buffer].commandword:=0A5H + 400H +
                        LONG(SIZE(netwareCommand))*10000H;
    END; (* with *)
    ELSE
    END; (* case *)

END DoCommand;

PROCEDURE GetInput(buffer:CARDINAL); (* nextin *)
VAR count:CARDINAL;
    ch:CHAR;
BEGIN
 (*disable card interrupts*)
 INB(ch,outputdataport);
```

```
WITH request[buffer] DO
 WORDIN(commandword);
 IF (ORD(commandword) MOD 256 <> 0A5H) THEN EHALT(1) END;
 count:=ORD(commandword DIV 10000H);

IF count<>0 THEN
  (* set IORDY *)
  OUTB(1,iniordyport);
  OUTB(1,outiordyport);

CHANIN(ADR(cmdBlock),count);  (* move data in *)

(* reset IORDY *)
  OUTB(0,iniordyport);
  OUTB(0,outiordyport);
 END;
 (* reenable card interrupts*)
 OUTB(1,inputdataport);

END; (*with*)
END GetInput;

PROCEDURE SendRest(buffer:CARDINAL);  (* nextout *)
VAR count:CARDINAL;
BEGIN
 (*disable card interrupts*)
 INB(ch,outputdataport);
 WITH request[buffer] DO
  count:=ORD(commandword DIV 10000H);
  count:=count + 3;  (* add 3 bytes for rest of commandword *)

(* set IORDY *)
  OUTB(1,iniordyport);
  OUTB(1,outiordyport);
                              (* move data out *)
  CHANOUT(ADR(commandword)+1,count);  (* first byte has already been sent *)
                 (* count:= 3 commandword + 32 cmdBlock + bufcount *)
  (* reset IORDY *)
  OUTB(0,iniordyport);
  OUTB(0,outiordyport);
 END; (* with *)
 (*enable card interrupts*)
 OUTB(1,inputdataport);
END SendRest;

PROCEDURE InterruptHandler;
BEGIN
 LOOP
  IOTRANSFER(intthread,mainthread,0DH);  (* Software Interrupt vector D=IRQ5 *)

DISABLE;  (*  MaskInterrupts; CLI; *)

INB(instatus,inputstatusport);
```

```
INB(outstatus,outputstatusport);
IF (readybit IN BITSET(ORD(instatus))) AND    (* readybit IN instatus *)
 (NOT((readybit IN BITSET(ORD(outstatus))) AND
         (intenablebit IN BITSET(ORD(outstatus))))) THEN
  GetInput(nextin);
  nextin:= (nextin+1) MOD 8;
ELSIF ((readybit IN BITSET(ORD(outstatus)))    (* readybit IN outstatus *)
        AND (intenablebit IN BITSET(ORD(outstatus))))
        AND NOT(readybit IN BITSET(ORD(instatus))) THEN
  SendRest(nextout);
  nextout:= (nextout+1) MOD 8;
  IF (nextout = lastdone) THEN
        OUTB(disableint,outputstatusport);    (* DisableOutputInt: *)
  ELSE
        OUTB(0A5H,outputdataport);        (* sendfirstcommandbyte[nextout]; *)
  END;
ELSE EHALT(9);            (* Illegal interrupt - Crash and Burn *)
END;
(*  UnMaskInterrupts; STI;  IOtransfer does this for us   *)
END; (* loop *)
END InterruptHandler;

BEGIN
 nextout:=0;
 lastdone:=0;
 nextin:=0;
 nextdo:=0;
 scanstate:=error;
 errorindex:=0;
 InitAdapter;  (* Needs to be able to select adapter *)
                (*INTenable bits are SET , Sets up IORDY *)
 OUTB(disableint,outputstatusport);    (* Disable Output Int: *)
 OUTB(disableint,inputstatusport);     (* Disable Input Int: *)
 NEWPROCESS(InterruptHandler,ADR(workspace),SIZE(workspace),intthread);
 InstallHandler(intthread,0DH);        (* Software Interrupt vector D=IRQ5 *)
 TRANSFER(mainthread,intthread);

OUTB(1,inputdataport);          (* Enable Link Adapter interrupts *)
 OUTB(enableint,inputstatusport);    (* Enable Input Interrupt *)

DISABLE;          (* Disable interrupts on processor *)
 SetDeviceStatus(5,TRUE);       (* enable Irq 5 in mask register *)
 ENABLE;           (* Enable interrupts on processor *)

(* Display copyright message to make j.c. and the lawyers happy. *)
  WriteLn;
  WriteString( "Standby Server Link Version 1.0");
  WriteLn;
  WriteString( "(C) Copyright 1993 Vinca Corporation. All rights reserved");
  WriteLn;
  WriteString( "Confidential Information. This computer software is confidential and is proprietary")
  WriteLn;
```

```
WriteString( "to Vinca Corporation and may not be copied, disclosed, transferred, decompiled.")
WriteLn;
WriteString( "disassembled, or reverse engineered without the advance written consent of")
WriteLn;
WriteString( "VINCA CORPORATION")

LOOP
  WHILE (nextin = nextdo) DO END;    (* wait until there is something to do *)
  nextdo:= (nextdo+1) MOD 8;

DoCommand(lastdone);         (* go do the command that was sent *)

IF (lastdone = nextout) THEN
    lastdone:=nextdo;
    OUTB(0A5H,outputdataport);      (* sendfirstcommandbyte[nextout]; *)
    OUTB(enableint,outputstatusport); (* EnableOutputInt; *)
  END;
  lastdone:= nextdo;

END;  (* loop *)

INB(outstatus,outputdataport);     (* Disable Link Adapter interrupts *)

END STNDBSVR
```

; This module is called from the STNDBSVR module. the Novell Netware Mass Storage Emulator DSK
developed by Vinca Corporation ; (C) Copyright 1993 Vinca Corporation. All rights reserved.

; This computer source code illustrates one preferred embodiment of the method of the invention entitled
; Method for Rapid Recovery from a Network File Server Failure by inventors Richard S. Ohran and Terry
; Dickson. The source code provided herein is merely illustrative of steps performed in one preferred
; embodiment of the method of the invention and is not intended to limit the scope of the invention in any
; way. Numerous alternative embodiments may implement the inventive concepts in a manner different
; from that disclosed herein. and each of those alternative embodiments is intended to be comprehended
; within the scope of the present invention as defined by the appended claims. *)

```
            TITLE   TLink

PUBLIC TLink_WORDIN,TLink_WORDOUT
            PUBLIC TLink_CHANIN,TLink_CHANOUT
            PUBLIC TLink_InitAdapter .286
TLink_DATA  SEGMENT BYTE PUBLIC 'DATA'

TLink_DATA  ENDS

DGROUP              GROUP TLink_DATA

TLink_TEXT  SEGMENT BYTE PUBLIC 'CODE'
            ASSUME  CS:TLink_TEXT,DS:DGROUP IN_OFF      EQU     0
OUT_OFF     EQU     1
ISTAT_OFF   EQU     2
OSTAT_OFF   EQU     3
IORDY_OFF   EQU     12H
IDEN_OFF    EQU     18
ODEN_OFF    EQU     19
RST_OFF             EQU     16
PortAdr     EQU     150H Byte0       db      1
Byte1       db      1
Byte2       db      1
Byte3       db      1

TLink_BYTEIN proc   FAR push    bp
            mov     bp,sp
            push    dx
            push    bx
```

```
                push    ax
                push    ds mov     dx,PortAdr
                add     dx,ISTAT_OFF
GetByteLoop1:
                in      al,dx
                test    al,1
                jnz     GetByteReady1
                jmp     GetByteLoop1
GetByteReady1:
                sub     dx,ISTAT_OFF
                in      al,dx
                lds     bx,[bp+6]
                mov     [bx],al pop     ds
                pop     ax
                pop     bx
                pop     dx
                pop     bp ret     4
TLink_BYTEIN    endp ;       PROCEDURE WORDIN(VAR data:LONGCARD);

TLink_WORDIN proc       FAR push    BP
                mov     BP,SP
;               push    the rest
                push    dx
                push    bx
                push    ax
                push    ds mov     dx,PortAdr
                add     dx,ISTAT_OFF
GetWordLoop1:
                in      al,dx
                test    al,1
                jnz     GetWordReady1
                jmp     GetWordLoop1
GetWordReady1:
                sub     dx,ISTAT_OFF
                in      al,dx
                mov     CS:Byte0,al
                add     dx,ISTAT_OFF
GetWordLoop2:
                in      al,dx
                test    al,1
```

```
                jnz     GetWordReady2
                jmp     GetWordLoop2
GetWordReady2:
                sub     dx,ISTAT_OFF
                in      al,dx
                mov     CS:Byte1,al
                add     dx,ISTAT_OFF
GetWordLoop3:
                in      al,dx
                test    al,1
                jnz     GetWordReady3
                jmp     GetWordLoop3
GetWordReady3:
                sub     dx,ISTAT_OFF
                in      al,dx
                mov     CS:Byte2,al
                add     dx,ISTAT_OFF
GetWordLoop4:
                in      al,dx
                test    al,1
                jnz     GetWordReady4
                jmp     GetWordLoop4
GetWordReady4:
                sub     dx,ISTAT_OFF
                in      al,dx
                mov     CS:Byte3,al
                lds     bx,[bp+6]
                mov     ax,WORD PTR CS:Byte0
                mov     [bx],ax
                mov     ax,WORD PTR CS:Byte2
                mov     [bx+2],ax pop     ds
                pop     ax
                pop     bx
                pop     dx
                pop     bp
                ret     4
TLink_WORDIN    endp ;       PROCEDURE WORDOUT(data:LONGCARD);
;

TLink_WORDOUT   proc    FAR push    BP
                mov     BP,SP
;               push    the rest
                push    dx
                push    ax mov     dx,PortAdr
                add     dx,OSTAT_OFF
```

```
PutWordLoop1:
            in      al,dx
            test    al,1
            jnz     PutWordReady1
            jmp     PutWordLoop1
PutWordReady1:
            mov     al,[bp+6]
            sub     dx,OSTAT_OFF-OUT_OFF
            out     dx,al
            add     dx,OSTAT_OFF-OUT_OFF PutWordLoop2:
            in      al,dx
            test    al,1
            jnz     PutWordReady2
            jmp     PutWordLoop2
PutWordReady2:
            mov     al,[bp+7]
            sub     dx,OSTAT_OFF-OUT_OFF
            out     dx,al
            add     dx,OSTAT_OFF-OUT_OFF PutWordLoop3:
            in      al,dx
            test    al,1
            jnz     PutWordReady3
            jmp     PutWordLoop3
PutWordReady3:
            mov     al,[bp+8]
            sub     dx,OSTAT_OFF-OUT_OFF
            out     dx,al
            add     dx,OSTAT_OFF-OUT_OFF PutWordLoop4:
            in      al,dx
            test    al,1
            jnz     PutWordReady4
            jmp     PutWordLoop4
PutWordReady4:
            mov     al,[bp+9]
            sub     dx,OSTAT_OFF-OUT_OFF
            out     dx,al pop     ax
            pop     dx
            pop     bp
            ret     4
TLink_WORDOUT   endp ;       PROCEDURE CHANIN(bufad:ADDRESS;cnt:CARDINAL);
;

TLink_CHANIN        proc    FAR
```

```
                push    bp
                mov     bp,sp
                push    di
                push    dx
                push    cx
                push    ax
                push    es mov     cx,[bp+6]
                les     di,[bp+8]
                cld
                mov     dx,PortAdr
                add     dx,ISTAT_OFF
GetBlockLoop:
                in      al,dx
                test    al,1
                jnz     GetBlockReady
                jmp     GetBlockLoop
GetBlockReady:
                sub     dx,ISTAT_OFF
                in      al,dx
                stosb
                add     dx,ISTAT_OFF
                loop    GetBlockLoop pop     es
                pop     ax
                pop     cx
                pop     dx
                pop     di
                pop     bp clc
                ret     6
TLink_CHANIN    endp TLink_CHANOUT   proc    FAR push    bp
                mov     bp,sp
                push    dx
                push    cx
                push    ax
                push    si
                push    ds cld
                lds     si,[bp+8]
                mov     cx,[bp+6]
                mov     dx,PortAdr
                add     dx,OSTAT_OFF
PutBlockLoop:
```

```
                in      al,dx
                test    al,1
                jnz     PutBlockReady
                jmp     PutBlockLoop
PutBlockReady:
                lodsb
                sub     dx,OSTAT_OFF-OUT_OFF
                out     dx,al
                add     dx,OSTAT_OFF-OUT_OFF
                loop    PutBlockLoop1
PutBlockLoop1:
                in      al,dx
                test    al,1
                jnz     PutBlockReady1
                jmp     PutBlockLoop1
PutBlockReady1:
                sub     dx,OSTAT_OFF-OUT_OFF
        rep     outsb pop     ds
                pop     si
                pop     ax
                pop     cx
                pop     dx
                pop     bp
                clc
                ret     6
TLink_CHANOUT   endp ;       PROCEDURE InitAdapter;
;
TLink_InitAdapter       PROC    FAR push    dx
                push    ax mov     dx,PortAdr
                xor     al,al
                add     dx,ISTAT_OFF
                out     dx,al           ; Disable adaptor interrupts (input)
                sub     dx,ISTAT_OFF
                add     dx,OSTAT_OFF
                out     dx,al           ; Disable adaptor interrupts (output)
                sub     dx,OSTAT_OFF
                add     dx,IDEN_OFF
                out     dx,al           ; Disable adaptor DMA (input)
                sub     dx,IDEN_OFF
                add     dx,ODEN_OFF
                out     dx,al           ; Disable adaptor DMA (output)

sub     dx,ODEN_OFF

; reset the link
```

```
                    add     dx,RST_OFF
                    mov     al,1
                    out     dx,al
                    mov     ax,30000
ResetLoop:          dec     ax
                    jnz     ResetLoop
                    mov     al,0
                    out     dx,al
                    mov     ax,30000
ResetLoop1:         dec     ax
                    jnz     ResetLoop1 sub     dx,RST_OFF
                    add     dx,OSTAT_OFF
                    in      al,dx
                    and     al,0FDH
                    out     dx,al
                    sub     dx,OSTAT_OFF add     dx,ISTAT_OFF
                    in      al,dx
                    test    al,0FEH
                    jz      init1
                    mov     ax,0            ; Return 0 if not found
                    jmp     SHORT init2
init1:
;       this section turns on IORDY
;                   mov     dx,PortAdr
;                   add     dx,IORDY_OFF
;                   mov     al,1
;                   out     dx,al
;                   inc     dx
;                   out     dx,al
;                   mov     dx,PortAdr
;                   add     dx,ISTAT_OFF
;                   mov     al,2
;                   out     dx,al
;                   sub     dx,ISTAT_OFF
;                   add     dx,OSTAT_OFF
;                   out     dx,al mov     ax,1            ; Return 1 if found
init2:
                    pop     ax
                    pop     dx ret
TLink_InitAdapter   ENDP TLink_TEXT   ENDS
             END
```

TLINK.DEF

```
DEFINITION MODULE TLink;
FROM SYSTEM IMPORT ADDRESS;
(*/NOMODINIT/NOCHECK:M*)

PROCEDURE WORDIN(VAR word:LONGCARD);
PROCEDURE WORDOUT(data:LONGCARD);
PROCEDURE CHANIN(bufad:ADDRESS;cnt:CARDINAL);
PROCEDURE CHANOUT(bufad:ADDRESS;cnt:CARDINAL);
PROCEDURE InitAdapter;

END TLink.
```

```
;       NetWare 3.X Device Driver
;       This DSK adapted for Standby Server Link from Vinca Corp.
;       Mass Storage Emulator DSK for Netware 3.X Systems
;       (C) Copyright Vinca Corporation, all rights reserved
;       Routines 3 and 4 adapted from Novell Professional DSK Developers Kit
;       Vinca Corporation Registered Professional Developer Program PDP ID. # 42422-03394
;       Date: October 1992
;       Last edited by: R. Ohran, PhD., Vinca Corporation, June 1993.

name    MassStorageEmulatorDSK assume  ds: OSDATA, es: OSDATA, ss: OSDATA

;************************* OUTLINE *************************
;--> MACROS
;--> EQUATES
;--> STRUCTURES
;--> DATA SEGMENT
;--> PUBLICS AND EXTERNS
;--> CODE SEGMENT ROUTINES:
;--> Routine # 1 - HBADriverInitialize            ; Initialize the device driver
;--> Routine # 2 - ConfigureHBA                   ; Configure AT HBA
;--> Routine # 3 - HBADriverRemove                ; Unload the driver image
;--> Routine # 4 - HBADeviceCheck                 ; Check devices linked to
driver image
;--> Routine # 5 - ScanForUnRegisteredDevices     ; Find all devices
;--> Routine # 6 - RegisterThisDevice             ; Register devices with NetWare
;--> Routine # 7 - SendToTestUnit                 ; Test the device
;--> Routine # 8 - DeleteAndRemoveDeviceRoutine   ; Delete registered devices
;--> Routine # 9 - DriverIOCTLPollRoutine         ; IOCTL Request entry poll routine
;--> Routine #10 - IOCTL_Function0                ; Search IOCTL Function 0 for
correct subfunctions
;--> Routine #11 - InvalidIOCTL                   ; Invalid IOCTL
;--> Routine #12 - ActivateTheDeviceSoNetWareCanUseIt     ; ActivateDevice
;--> Routine #13 - DeActivateTheDeviceSoNetWareCantUseIt  ; DeActivateDevice
;--> Routine #14 - FormatTheMediaOnTheSelectedDevice      ; IOCTLFormat
;--> Routine #15 - SetUpTheTypeOfReadAfterWriteVerifyOnTheDevice ; ReadAfterWriteDeviceVerify
;--> Routine #16 - FlashTheLightToIdentifyWhichDeviceWeAreLookingAt ; IdentifyStatus
;--> Routine #17 - DriverIOPollRoutine            ; IO Request entry from NetWare
;--> Routine #18 - DriverISR                      ; Adapter Int3errupt Service
Routine
;--> Routine #19 - DriverTimeOutRoutine           ; Setup AES Timeout events
;--> Routine #20 - GetHBABuffer                   ; Retrieve valid buffer resource
from pool
;--> Routine #21 - ReturnHBABuffer                ; Return buffer resource to pool
;--> Routine #22 - SetupHBACommand                ; Build the HBA command block
;--> Routine #23 - SendHBACommand                 ; Send the HBA command block to
the HBA interface
;--> Routine #24 - DequeueRequests                ; Remove all IO requests for failed
devices
;--> Routine # 25 - GetMessageProc                ; Get messages
;--> Routine # 26 - GetByteProc                   ; Get byte from link card comm
;--> Routine # 27 - GetWordProc                   ; Get word from link card comm
```

```
;--> Routine # 28 - PutWordProc          ; Puts word to link card comm
;--> Routine # 29 - GetBlockProc         ; Gets block from link card comm
;--> Routine # 30 - PutBlockProc         ; Puts block to link card comm
;--> Routine # 31 - InitAdapterProc      ; Initialize adapter link card
;--> Routine # 32 - InterruptsOnProc     ; Turn link interrupt on
;--> Routine # 33 - InterruptsOffProc    ; Turn link interrupt off
;

;*********************************************************************

;************************** MACROS ***********************************
Debug = 0
CPush   macro
        push    ebp
        push    ebx
        push    esi
        push    edi
        endm CPop    macro
        pop     edi
        pop     esi
        pop     ebx
        pop     ebp
        endm Slow    macro
        local   label1, label2
        jmp     short   label1
label1:
        jmp     short   label2
label2:
        endm

;************************** END MACROS *******************************

;************************** EQUATES **********************************

; used to fetch values from the stack

ParmOffset          equ     20
Parm0               equ     ParmOffset + 0
Parm1               equ     ParmOffset + 4
Parm2               equ     ParmOffset + 8
Parm3               equ     ParmOffset + 12
Parm4               equ     ParmOffset + 16
Parm5               equ     ParmOffset + 20
Parm6               equ     ParmOffset + 24
Parm7               equ     ParmOffset + 28
Parm8               equ     ParmOffset + 32
Parm9               equ     ParmOffset + 36
Parm10              equ     ParmOffset + 40
Parm11              equ     ParmOffset + 44
```

; completion codes for I/O and IOCTL requests

| | | |
|---|---|---|
| NOERROR | equ | 0h |
| CORRECTEDMEDIAERROR | equ | 1h |
| MEDIAERROR | equ | 2h |
| NONMEDIAERROR | equ | 3h |
| INACTIVEDEVICE | equ | 04h |

; need bits used when calling ParseDriverParameters

| | | |
|---|---|---|
| NeedsIOSlotBit | equ | 1h |
| NeedsIOPort0Bit | equ | 2h |
| NeedsIOLength0Bit | equ | 4h |
| NeedsIOPort1Bit | equ | 8h |
| NeedsIOLength1Bit | equ | 10h |
| NeedsMemoryDecode0Bit | equ | 20h |
| NeedsMemoryLength0Bit | equ | 40h |
| NeedsMemoryDecode1Bit | equ | 80h |
| NeedsMemoryLength1Bit | equ | 100h |
| NeedsInterrupt0Bit | equ | 200h |
| NeedsInterrupt1Bit | equ | 400h |
| NeedsDMA0Bit | equ | 800h |
| NeedsDMA1Bit | equ | 1000h |

; IOCTL function and subfunction values

| | | | |
|---|---|---|---|
| ReadRequest | equ | 0 | ; normal read request |
| WriteRequest | equ | 1 | ; normal write request |
| RawReadRequest | equ | 2 | ; read with no retries |
| RawWriteRequest | equ | 3 | ; write with no retries |
| | | | |
| IOCTLInterface | equ | 0 | |
| ActivateDevice | equ | 0 | ; Active sub-function |
| DeactivateDevice | equ | 1 | ; Deactivate sub-function |
| DeviceVerify | equ | 3 | ; verify sub-function |
| | | | |
| IOCTLNotSupported | equ | -7 | |

; used with AddDiskSystem

| | | |
|---|---|---|
| NOVELLASSIGNEDDRIVERNUMBER | equ | 34H |

; used with DriverTimeOutRoutine

| | | | |
|---|---|---|---|
| TimeOutAmount | equ | 18 * 5 | ; only an example |
| TIMEOUTLIMIT | equ | 18 * 40 | ; I want the HBA to time out first |

; these signatures are used for resource tracking under V3.X

| | | |
|---|---|---|
| AESProcessSignature | equ | 50534541h |
| AllocSignature | equ | 54524C41h |
| EventSignature | equ | 544E5645h |
| DiskDriverSignature | equ | 4B534444h |

```
InterruptSignature          equ    50544E49h
IORegistrationSignature     equ    53524F49h
TimerSignature              equ    524D4954h TRANSHeads                  equ    64     ;translated head count for special drives reporting >
64 sec/trk
TRANSSec                    equ    32     ;translated sector count allows up to approx 1.2Gig
MAXSec                      equ    64     ;maximum sec/trk before translation is needed
```

;************************* END EQUATES ******************************

;************************* STRUCTURES ******************************

; used with AddDiskSystem, ParseDriverParameters, RegisterHardwareOptions, DeRegisterHardwareOptions

```
IOConfigurationStructure struc
    CLink                dd    ?
    CFlags               dw    ?
    CSlot                dw    ?
    CIOPort0             dw    ?
    CIOLength0           dw    ?
    CIOPort1             dw    ?
    CIOLength1           dw    ?
    CMemoryDecode0       dd    ?
    CMemoryLength0       dw    ?       ; In Paragraphs
    CMemoryDecode1       dd    ?
    CMemoryLength1       dw    ?
    CInterrupt0          db    ?
    CInterrupt1          db    ?
    CDMAUsage0           db    ?
    CDMAUsage1           db    ?
    CIORTag              dd    ?
    CReserved1           dd    ?
    CReserved2           dd    ?
    CReserved3           db    18 dup (?)
    CReserved4           db    16 dup (?)
IOConfigurationStructure ends
```

; used with ParseDriverParameters

```
AdapterOptionDefinitionStructure struc
    IOSlot               dd    ?
    IOPort0              dd    ?
    IOLength0            dd    ?
    IOPort1              dd    ?
    IOLength1            dd    ?
    MemoryDecode0        dd    ?
    MemoryLength0        dd    ?
    MemoryDecode1        dd    ?
    MemoryLength1        dd    ?
    Interrupt0           dd    ?
    Interrupt1           dd    ?
    DMA0                 dd    ?
```

```
DMA1                              dd    ?
AdapterOptionDefinitionStructure  ends ; DriverIOPollRoutine calls GetRequest to get this disk I/O request from NetWare.
; DriverIOPollRoutine calls PutRequest to give the request back.

IORequestStructure      struc
    SDriverLink             dd   ?
    SDiskHandle             dd   ?
    SCompletionCode         dw   ?
    SFunction               db   ?
    SNumberOfSectors        db   ?
    SStartingSector         dd   ?
    SBufferAddress          dd   ?
IORequestStructure      ends ; NetWare passes this IOCTL request structure to DriverIOCTLPollRoutine. DriverIOCTLPollRoutine or
; one of the driver's IOTCL procedures calls PutIOCTL to return the structure
; to NetWare.

IOCTLRequestStructure   struc
    IDriverLink             dd   ?
    ICardHandle             dd   ?
    ICompletionCode         dw   ?
    IFunction               db   ?
    ISubFunction            db   ?
    IFunctionParameter      dd   ?
    IFunctionBuffer         dd   ?
IOCTLRequestStructure   ends ; HBADriverInitialize calls ScheduleNoSleepAESProcessEvent to pass this structure to
; NetWare. After AESWakeUpInterval, NetWare calls AESProcessToCall which
; reschedules the AESEvent again.

AESEventStructure       struc
    AESReserve0             dd   ?
    AESWakeUpInterval       dd   ?
    AESReserve1             dd   ?
    AESProcessToCall        dd   ?
    AESResourceTag          dd   ?
    AESReserve2             dd   ?
    AESReserve3             dd   ?
AESEventStructure       ends ; Template for a HBA card specific structure. This has been commented out in this Sample because most
; card structures are too specific to their own method.

HBACardSpecificStructure    struc
    HBACSIOConfig               dd   ?
    HBACSISRRoutine             dd   ?
    HBACSAESEvent               dd   ?
    HBACSDiskRoot               dd   ?
    HBACSDriveFlags             dd   0
    HBACSCardNum                dd   ?
```

```
HBACSModuleHandle              dd    ?
HBACardHandle                  dd    ?
HBACSPortAdr                   dd    ?
HBACSTimeOutLeft               dw    ?
HBACardSpecificStructure             structure. This has been commented out in this Sample
because most
; disk structures are too specific to their own method.

HBADiskSpecificStructure       struc
    DSParam1                   dd    ?
    DSNextDisk                 dd    ?
    DSCardHandle               dd    ?
    DSParam4                   dd    ?
    DSCurrentIORequest1        dd    ?
    DSCurrentIORequest2        dd    ?
    DSCurrentIOCTLRequest      dd    ?
    DSIOCTLtoPost              dd    ?
    DSCurrentBuffer            dd    ?
    DSTimeOut1                 dd    ?
    DSTimeOut2                 dd    ?
    DSDeviceNum                dd    ?
    DSDiskName                 dd    ?
    DSDiskNum                  db    ?
    DSControllerNum            db    ?
    DSDiskActiveFlag           db    ?
    DSVerifyMode               db    ?
    DSFlashFlag                db    ?
HBADiskSpecificStructure       ends ; These structures are a template for setting up device parameters DiskControllerTableStructure   struc
    ControllerType             dw    ?
    DriveType0                 dw    ?
DiskControllerTableStructure   ends DiskTypeStructure              struc
    ScanDriveResponseAdr       dd    ?
    ScanDriveWaitForInt        db    ?
    ScanDriveNum               db    ?
    ScanDriveSector            db    ?
    ScanDriveHead              db    ?
    ScanDriveCylinder          dw    ?
    ScanDriveType              db    ?
    ScanDriveNameLen           db    ?
    ScanDriveName              db    60 dup (0)
DiskTypeStructure              ends
```

; This is a template for the HBA request block as it appears to the HBA. This
; has been commented out because it is too specific to this implementation. A
; standard request block for the SCSI HBA interface needs to be defined. Some
; of these parameters relied on the hardware for their values. Your
; implementation would require hardware or software to provide similar values.

```
HBARequestBlock          struc
    DNextRequest         dd      ?
    DResponseAddress     dd      ?
    DDiskHandle          dd      ?
    DCurrentRequest      dd      ?
    DCurrentIOCTL        dd      ?
    DCompletionCode      dw      ?
    DFunction            dw      ?
    DDiskNum             dw      ?
    DNumberOfSectors     dw      ?
    DStartingSectorLow   dw      ?
    DStartingSectorHigh  dw      ?
    DBufferAddress       dd      ?
HBARequestBlock          ends
```

;************************* END STRUCTURES *******************************

;************************* DATA *****************************************

OSDATA      segment rw public 'DATA'

; Variables used during driver initialization

```
HBACardList          dd      4 dup (0)
ISRRoutine           dd      ISR0, ISR1, ISR2, ISR3

CurrentIOConfig      dd      ?
CurrentCardHandle    dd      ?
CommandLine          dd      ?
ModuleHandle         dd      ?
ScreenHandle         dd      ?
FileHandle           dd      ?
ReadRoutine          dd      ?
ReadOffset           dd      ?
ReadSize             dd      ?

CardNumberUsed       dw      -1
CurrentCardNum       dd      0
```

; We need a dummy disk structure for initialization, and scan routine.

TempDiskStruct       HBADiskSpecificStructure     <>

; These are dummy structures for IOCTL calls.

IOCTLDiskHandle      HBADiskSpecificStructure     <0,0,0,0,0,0,7,0>

CheckDiskRequest     IORequestStructure <0,0,0,2,0,0,0>
CheckDiskHandle      HBADiskSpecificStructure     <>

;DriverID is used in AddDiskSystem
DriverID    db      0,0,0,NOVELLASSIGNEDDRIVERNUMBER ; These variables are used for adding disks

```
DiskSize                dd      ?
Cylinders               dw      ?
Heads                   db      ?
Sectors                 db      ?
CurrentDiskName                 dd      ?
ScanAnswer              DiskTypeStructure <.........>
RequestBlock1           HBARequestBlock <....>
RequestBlock2           HBARequestBlock <....>

; workspace for link IO
Byte0   db      ?
Byte1   db      ?
Byte2   db      ?
Byte3   db      ?
MessageCount    DW      ?
MessageCode     db      ?

; OS calls in HBADriverInitialize routine use these variables and structures.

ATPorts                 dd      2, 0150h, 0300h, 0320h, 0328h
ATInts                  dd      2, 5, 11, 10, 15

HBAAdapterInfo          AdapterOptionDefinitionStructure <,ATPorts,........,ATInts,..>

; DriverTimeOutRoutine structures

AES0    AESEventStructure       <,TimeOutAmount,,DriverTimeOutRoutine0,..>
AES1    AESEventStructure       <,TimeOutAmount,,DriverTimeOutRoutine1,..>
AES2    AESEventStructure       <,TimeOutAmount,,DriverTimeOutRoutine2,..>
AES3    AESEventStructure       <,TimeOutAmount,,DriverTimeOutRoutine3,..>

HBAAESList              dd      AES0, AES1, AES2, AES3

CheckDeviceStatus       dd      ?

; Error messages for driver.
HBADebug1                       db      'ready to configure',13,10,0
HBAConfig                       db      'Card=%d Port=%xh Int=%d ',13,10,0
BoardHeader                     db      13,10,'Current VINCA settings are: ',0
InitializeBoardMsg              db      13,10,'>>> Initializing board <<<',13,10,0
HBAPromptHeaderMsg              db      13,10,'Host Bus Adapter Initialization Error:',13,10,0
HBAPromptInitializeMsg          db      13,10,'Host Bus Adapter Initialization Completed',13,10,0
CantHandleAnyMoreHBAsMsg        db      '--->>>* Too many Cards being installed.',13,10,10,0
RegisterHardwareParseParmMsg    db      '--->>>* ParseDriverParameters or RegisterHardwareOptions
failed',13,10,10,0
DriverInitCompleteMsg           db      '--->>>* Driver Init Complete returned error (possible
hardware)',13,10,10,0
MemoryAllocationErrorMsg        db      '--->>>* Error allocating memory for
configuration',13,10,10,0
InitializeFailureMsg            db      '--->>>* The board does not respond or failed
diagnostics',13,10,10,0
NoBoardFailureMsg               db      '--->>>* A board was not found at the specified
location',13,10,10,0
```

;These variables are used for resource tracking with v3.X

```
HBARTag             dd      0
AesRTag             dd      0
IrqRTag             dd      0
MemRTag             dd      0
CfgRTag             dd      0
TmrRTag             dd      0
Dummy               dd      0

HBARTagString       db      'SAMPLHBA Driver', 0
AesRTagString       db      'SAMPLHBA AES', 0
IrqRTagString       db      'SAMPLHBA Irq', 0
MemRTagString       db      'SAMPLHBA Mem', 0
CfgRTagString       db      'SAMPLHBA Cfg', 0
TmrRTagString       db      'TIMER TAG', 0

TagsAllocatedFlag   dd      0       ;non zero when tags are allocated
```

; DriverIOCTLPollRoutine accesses the driver's IOCTL procedures through this table.

```
DriverIOCTLPollRoutineJumpTable  dd   IOCTL_Function0    ;0
                                 dd   IOCTL_Function1    ;1
                                 dd   IOCTL_Function2    ;2
                                 dd   IOCTL_Function3    ;3
                                 dd   InvalidIOCTL       ;4
```

;************************* END DATA *********************************

```
OSDATA      ends

OSCODE      segment er public 'CODE' assume  cs: OSCODE public  HBADeviceCheck
            public  HBADriverInitialize
            public  HBADriverRemove
```

;#ifdef Debug
; The following publics must only be enabled during development and must not be
; in final release code.
```
            public  DeleteAndRemoveDeviceRoutine
            public  DriverIOCTLPollRoutine
            public  DriverIOPollRoutine
            public  DriverISRCommon
            public  DriverTimeOutCommon
            public  ScanForUnRegisteredDevices
```
;#endif

```
            extrn   AddDiskDevice: near
            extrn   AddDiskSystem: near
            extrn   AlertDevice: near
;           extrn   AlertSystem: near
```

```
        extrn   Alloc: near
        extrn   AllocateResourceTag: near
        extrn   CancelNoSleepAESProcessEvent: near
        extrn   CDisableHardwareInterrupt: near
        extrn   CDoEndOfInterrupt: near
        extrn   CEnableHardwareInterrupt: near
        extrn   CheckDiskCard: near
        extrn   ClearHardwareInterrupt: near
        extrn   CRescheduleLast: near
        extrn   DelayMyself: near
        extrn   DeleteDiskDevice: near
        extrn   DeleteDiskSystem: near
        extrn   DeRegisterHardwareOptions: near
        extrn   Free: near
        extrn   GetCurrentTime: near
        extrn   GetIOCTL: near
        extrn   GetRequest: near
        extrn   MapAbsoluteAddressToDataOffset: near
        extrn   OutputToScreen: near
        extrn   ParseDriverParameters: near
        extrn   PutIOCTL: near
        extrn   PutRequest: near
        extrn   RegisterHardwareOptions: near
        extrn   RemoveDiskDevice: near
        extrn   ScheduleNoSleepAESProcessEvent: near
        extrn   SetHardwareInterrupt: near

;*************************** ROUTINES *******************************

;*** Program Start ***************************************************
;*********************************************************************
;       This is the Start Routine as named in the *.def file.
;       Values are pushed on the stack and passed to the loadable module start routine.
;
;       When this driver is loaded from the command line this routine is called first.
;
;**************************************************
;-- Routine # 1 -- HBADriverInitialize
;**************************************************
;
;               ccode = HBADriverInitialize(
;       (Parm0)                 LONG ModuleHandle,
;       (Parm1)                 LONG ScreenHandle,
;       (Parm2)                 CommandLine,
;       (Parm3)                 LoadDirectoryPath,
;       (Parm4)                 UninitializedDataSize,
;       (Parm5)                 LoadableModuleFileHandle,
;       (Parm6)                 ReadRoutine,
;       (Parm7)                 CustomDataOffset,
;       (Parm8)                 CustomDataSize)
;

HBADriverInitialize     proc    near
        CPush
```

```
        cli
        mov     eax, [esp + Parm0]      ;save all needed parameters from stack
        mov     ModuleHandle, eax
        mov     eax, [esp + Parm1]
        mov     ScreenHandle, eax
        mov     eax, [esp + Parm2]
        mov     CommandLine, eax
;;      mov     eax, [esp + Parm5]
;;      mov     FileHandle, eax
;;      mov     eax, [esp + Parm6]
;;      mov     ReadRoutine, eax
;;      mov     eax, [esp + Parm7]
;;      mov     ReadOffset, eax
;;      mov     eax, [esp + Parm8]
;;      mov     ReadSize, eax
; make sure resource tags are only allocated once
        cmp     TagsAllocatedFlag, 1
        je      TagsDone ; Set up Driver Resource Tags
        push    DiskDriverSignature
        push    OFFSET HBARTagString
        push    ModuleHandle
        call    AllocateResourceTag
        add     esp, 4 * 3
        mov     HBARTag, eax            ;save rtag ; Set up AES Resource Tags
        push    AESProcessSignature
        push    OFFSET AesRTagString
        push    ModuleHandle
        call    AllocateResourceTag
        add     esp, 4 * 3
        mov     AesRTag, eax
        mov     AES0.AESResourceTag, eax
        mov     AES1.AESResourceTag, eax
        mov     AES2.AESResourceTag, eax
        mov     AES3.AESResourceTag, eax ; Set up Interrupt Resource Tags
        push    InterruptSignature
        push    OFFSET IrqRTagString
        push    ModuleHandle
        call    AllocateResourceTag
        add     esp, 4 * 3
        mov     IrqRTag, eax ; Set up Memory Resource Tags
        push    AllocSignature
        push    OFFSET MemRTagString
        push    ModuleHandle
        call    AllocateResourceTag
        add     esp, 4 * 3
```

```
            mov     MemRTag, eax

; Set up IO Configuration Structure Resource Tags
            push    IORegistrationSignature
            push    OFFSET CfgRTagString
            push    ModuleHandle
            call    AllocateResourceTag
            add     esp, 4 * 3
            mov     CfgRTag, eax ; Set up Timer Resource Tags
            push    TimerSignature
            push    OFFSET TmrRTagString
            push    ModuleHandle
            call    AllocateResourceTag
            add     esp, 4*3
            mov     TmrRTag, eax mov     TagsAllocatedFlag, 1        ;all tags are allocated once TagsDone:

xor     eax, eax                    ;find unused card number
            bsf     eax, dword ptr CardNumberUsed
            btr     CardNumberUsed, ax
            mov     CurrentCardNum, eax
            cmp     eax, 1                      ; compare to X number of boards supported -1
            ja      NoMoreHBAS push    MemRTag
            push    SIZE IOConfigurationStructure   ;get memory for configuration info
            call    Alloc                           ; acquisition A
            lea     esp, [esp + 2*4]
            or      eax, eax
            jz      ErrorAllocatingMemory
            mov     CurrentIOConfig, eax mov     ecx, SIZE IOConfigurationStructure  ;zero out config structure
            mov     edi, eax
            xor     eax, eax
            rep     stosb
            mov     edi, CurrentIOConfig
            mov     [edi].CIOLength0, 1
            mov     [edi].CInterrupt1, -1
            mov     [edi].CDMAUsage0, -1
            mov     [edi].CDMAUsage1, -1
            mov     eax, CfgRTag
            mov     [edi].CIORTag, eax
            mov     edx, NeedsIOPort0Bit + NeedsInterrupt0Bit push    ScreenHandle                ;get port info
            push    CommandLine
            push    edx
```

```
        push    0
        push    0
        push    offset  HBAAdapterInfo
        push    0
        push    edi
        call    ParseDriverParameters
        lea     esp, [esp + 8*4]
        or      eax, eax
        jnz     CheckHardwareError ; debug message
        push    offset HBADebug1
        push    ScreenHandle
        call    OutputToScreen
        lea     esp, [esp + 2*4]

call    ConfigureHBA
        or      eax, eax
        jnz     NoBoardError
        push    0
        push    CurrentIOConfig
        call    RegisterHardwareOptions
        lea     esp, [esp + 2*4]
        or      eax, eax
        jnz     CheckHardwareError mov     ebx, CurrentIOConfig
        push    SIZE HBACardSpecificStructure
        push    HBARTag
        push    NOVELLASSIGNEDDRIVERNUMBER
        push    OFFSET DeleteAndRemoveDeviceRoutine
        push    OFFSET ScanForUnRegisteredDevices
        push    offset DriverIOCTLPollRoutine
        push    ebx
        push    ModuleHandle
        call    AddDiskSystem
        lea     esp, [esp + 8*4]
        or      eax, eax
        jz      ErrorAddingCardToTheOS
        mov     CurrentCardHandle, eax
        mov     eax, CurrentCardNum          ;set up and save structure
        mov     ebp, CurrentCardHandle
        mov     HBACardList[eax*4], ebp
        mov     ebx, CurrentIOConfig
        mov     [ebp].HBCSIOConfig, ebx
        mov     ebx, ISRRoutine[eax*4]
        mov     [ebp].HBACSISRRoutine, ebx
        mov     ebx, HBAAESList[eax*4]
        mov     [ebp].HBACSAESEvent, ebx
        mov     [ebp].HBACSCardNum, eax
        mov     ebx, ModuleHandle
        mov     [ebp].HBACSModuleHandle, ebx
        mov     ebx, CurrentIOConfig
```

```
        movzx   eax, [ebx].CIOPort0
        mov     [ebp].HBACSPortAdr, eax push    [ebp].HBACSAESEvent
        call    ScheduleNoSleepAESProcessEvent
        lea     esp, [esp + 1*4]
        cli
        lea     eax, Dummy
        push    eax
        push    0                   ;not shared
        push    0
        push    IrqRTag
        movzx   eax, [ebx].CInterrupt0
        push    [ebp].HBACSISRRoutine
        push    eax
        call    SetHardwareInterrupt
        lea     esp, [esp + 6*4]
        mov     [ebp].HBACSDiskRoot, 0
        mov     [ebp].HBACSDriveFlags, 0
        call    InterruptsOn        ;ebp has card handle push    eax
        call    CEnableHardwareInterrupt
        lea     esp,[esp+1*4]

;#ifdef  Debug
        push    offset HBAPromptInitializeMsg
        push    ScreenHandle
        call    OutputToScreen
        lea     esp, [esp + 2*4]
;#endif
        mov     ScreenHandle, 0
        xor     eax, eax
        CPop
        ret                         ; exit with zero status ; Error handling code for HBADriverInitialize NoMoreHBAS:
        lea     eax, CantHandleAnyMoreHBAsMsg
        call    ErrorMessageDisplayRoutine
        mov     eax, -1
        CPop
        ret                         ; exit with non-zero status ErrorAllocatingMemory:
        mov     eax, CurrentCardNum
        bts     CardNumberUsed, ax
        lea     eax, MemoryAllocationErrorMsg
        call    ErrorMessageDisplayRoutine
```

```
            mov    eax, -1
            CPop
            ret                                     ; exit with non-zero status CheckHardwareError:
            mov    eax, CurrentCardNum
            bts    CardNumberUsed, ax
            push   CurrentIOConfig
            call   Free                             ; return of acquisition A
            lea    esp, [esp + 1*4]
            lea    eax, RegisterHardwareParseParmMsg
            call   ErrorMessageDisplayRoutine
            mov    eax, -1
            CPop
            ret                                     ; exit with non-zero status ErrorAddingCardToTheOS:
            mov    eax, CurrentCardNum
            bts    CardNumberUsed, ax
            push   CurrentIOConfig
            call   DeRegisterHardwareOptions
            lea    esp, [esp + 1*4]
            push   CurrentIOConfig
            call   Free                             ; return of acquisition A
            lea    esp, [esp + 1*4]
            lea    eax, DriverInitCompleteMsg
            call   ErrorMessageDisplayRoutine
            mov    eax, -1
            CPop
            ret                                     ; exit with non-zero status NoBoardError:
            mov    eax, CurrentCardNum
            bts    CardNumberUsed, ax
            push   CurrentIOConfig
            call   Free                             ; return of acquisition A
            lea    esp, [esp + 1*4]
            lea    eax, NoBoardFailureMsg
            call   ErrorMessageDisplayRoutine
            mov    eax, -1
            CPop
            ret                                     ; exit with non-zero status ErrorMessageDisplayRoutine:
            push   eax
            push   ScreenHandle
            push   offset HBAPromptHeaderMsg
            push   ScreenHandle
            call   OutputToScreen
            lea    esp, [esp + 2*4]
            call   OutputToScreen
            lea    esp, [esp + 2*4]
            ret
```

HBADriverInitialize    endp

;********************************
;--> Routine # 2 - ConfigureHBA
;********************************

```
ConfigureHBA   proc    near
        xor     eax, eax
        mov     ebx, CurrentIOConfig        ;check specified slot for HBA
        mov     dx, [ebx].CIOPort0

;check for Link Adapter Present
        call    InitAdapter
        cmp     ax, 1                       ;is adapter present jne     ErrorExit                   ;no movzx   eax, [ebx].CInterrupt0
        push    eax
        movzx   eax, [ebx].CIOPort0
        push    eax
        mov     eax, CurrentCardNum
        push    eax
        lea     eax, HBAConfig
        push    eax
        push    ScreenHandle
        push    OFFSET BoardHeader
        push    ScreenHandle
        call    OutputToScreen
        lea     esp, [esp + 2*4]
        call    OutputToScreen
        lea     esp, [esp + 5*4]
        xor     eax, eax
        ret
ErrorExit:
        mov     eax, 1
        ret
ConfigureHBA   endp
```

;************************************
;--> Routine # 3 - HBADriverRemove
;************************************

```
HBADriverRemove        proc    near
        CPush
        cli
        xor     eax, eax
UnloadNextCard:
        cmp     eax, 1                      ;compare X number of cards -1
        ja      UnloadDone                  ;do all cards (X possible)
        mov     ebp, HBACardList[eax*4]     ;get card handle
        cmp     ebp, 0                      ;is this card real?
```

```
                je      ThisCardDone                    ;no
                mov     edi, [ebp].HBACSDiskRoot        ;delete all active devices
                push    eax                             ;save card #
        UnloadNextDisk:
                cmp     edi, 0
                je      UnInitNoMoreDrives
                push    2
                push    edi
                call    RemoveDiskDevice
                lea     esp, [esp + 2*4]
                push    edi
                call    DeleteDiskDevice
                lea     esp, [esp + 1*4]
                push    [edi].DSDiskName                ;return memory from disk name
                call    Free                            ; return of acquisition A
                lea     esp, [esp + 1*4]
                mov     edi, [edi].DSNextDisk           ;get next disk
                mov     [ebp].HBACSDiskRoot, edi
                jmp     UnloadNextDisk
        UnInitNoMoreDrives:
                mov     ebx, [ebp].HBACSIOConfig
                movzx   eax, [ebx].CInterrupt0
                mov     ebx, [ebp].HBACSISRRoutine
                push    ebx
                push    eax
                call    ClearHardwareInterrupt
                lea     esp, [esp + 2*4]
                mov     ebx, [ebp].HBACSAESEvent
                push    ebx
                call    CancelNoSleepAESProcessEvent
                lea     esp, [esp + 1*4]
                mov     ebx, [ebp].HBACSIOConfig
                push    ebx
                call    DeRegisterHardwareOptions
                call    Free                            ; return of acquisition A
                lea     esp, [esp + 1*4]
                push    ebp
                call    DeleteDiskSystem
                lea     esp, [esp + 1*4]
                pop     eax ThisCardDone:
                inc     eax
                jmp     UnloadNextCard UnloadDone:
                CPop
                ret
        HBADriverRemove endp ;*********************************
;--> Routine # 4 - HBADeviceCheck
;*********************************
```

```
;
;       DiskCheck(
;               LONG ScreenHandle)
;
HBADeviceCheck          proc    near
        cli
        CPush
        mov     CheckDeviceStatus, 0
        xor     eax, eax
        mov     ecx, [esp + Parm0]
CheckNextCard:
        cmp     eax, 1                          ;check X possible cards -1
        ja      CheckDone
        mov     ebp, HBACardList[eax*4]
        cmp     ebp, 0
        je      ThisCheckDone
        push    eax
        push    ecx
        mov     eax, ecx
        push    eax
        push    ebp
        call    CheckDiskCard
        lea     esp, [esp + 2*4]
        or      CheckDeviceStatus, eax          ;combine status for all cards
        pop     ecx
        pop     eax
ThisCheckDone:
        inc     eax
        jmp     CheckNextCard
CheckDone:
        mov     eax, CheckDeviceStatus
        CPop
        ret
HBADeviceCheck          endp ;**********************************************
;--> Routine # 5 - ScanForUnRegisteredDevices
;**********************************************
;
; It is important that the driver must determine the parameters of all devices
; attached to the HBA and initialized them in the appropriate variables used
; in ScanForUnRegisteredDevices and the RegisterThisDevice call. The best place
; to initialize these variables is during the HBADriverInitialize call. In this
; sample driver the code to initialize these variables has been removed since the
; method to obtain the information varies greatly between systems.
;
ScanForUnRegisteredDevices      proc    near
        CPush
        cli
        mov     ebp, [esp + Parm0]              ;get card handle ; restart scan for devices in remote subsystem
; resetscancommand = 000001A5H
```

```
;       mov     eax,resetscancommand
        mov     eax,01A5H
        call    PutWord              ;ebp = card handle, eax = data
        jc      ScanTimeOutErr
; call scan routine WaitForInt              EQU     12H
ScanTimeOutCount        EQU     1000H DriveScanLoop:
; nextscancommand = 000402A5H
;       mov     eax,nextscancommand
        mov     eax,402A5H
        call    PutWord              ;(edp=cardhandle, eax = data
        jc      ScanTimeOutErr
        mov     ebx,offset ScanAnswer
        mov     [ebx].ScanDriveResponseAdr,ebx   ;setup sanity check
        mov     [ebx].ScanDriveWaitForInt,WaitForInt
        mov     eax,ebx
        call    PutWord
        jc      ScanTimeOutErr mov     eax,ScanTimeOutCount
        mov     ebx,offset ScanAnswer
        call    WaitForInterrupt     ;eax = count,ebx = flag
        jc      ScanTimeOutErr cmp     [ebx].ScanDriveNum,0
        je      DriveScanDone mov     esi,ebx call    RegisterThisDevice   ;scan msg in esi
        jmp     DriveScanLoop DriveScanDone:
ScanTimeOutErr:
        xor     eax, eax
        clc
        CPop
        ret ScanForUnRegisteredDevices      endp WaitForInterrupt proc
        CPush
        mov     [ebp].HBACSTimeOutLeft,ax
        sti
KeepWaiting:
        mov     ecx,50000
WaitIntLoop:
        cmp     [ebx].ScanDriveWaitForInt,WaitForInt
        jne     FoundInt
        pushad
```

```
                call    CRescheduleLast
                popad
                loop    WaitIntLoop
                dec     [ebp].HBACSTimeOutLeft
                jz      LoopTimedOut
                jmp     KeepWaiting FoundInt:

cmp     [ebx].ScanDriveWaitForInt,WaitForInt cli
                cmp     [ebp].HBACSTimeOutLeft,0
                je      LoopTimedOut
                mov     [ebp].HBACSTimeOutLeft,0
                CPop
                xor     eax,eax
                clc
                ret LoopTimedOut:
                CPop
                xor     eax,eax
                stc
                ret WaitForInterrupt endp ;**************************************
;--> Routine # 6 - RegisterThisDevice
;**************************************
;       on entry: ebp=CardHandle, esi=scan message
;                 ebx=controller # (0-7), eax=device # (1-X)
;
;       on exit: These regs must be preserved, new disk will have been added to os.
;**************************************

RegisterThisDevice      proc    near
        push    ebp
        push    ebx
        push    esi
        push    eax
        mov     edi, OFFSET TempDiskStruct      ;set up dummy structure
        movzx   eax,[esi].ScanDriveNum
        mov     [edi].DSDeviceNum, eax
        bts     [ebp].HBACSDriveFlags, eax      ;is device already in system
        jc      DriveAlreadyPresent             ;yes
        mov     [edi].DSControllerNum, bl       ;save correct controller # push    eax                             ;these 3 must be saved
        push    ebx
```

```
        push    edi
        movzx   eax, [esi].ScanDriveNum        ;get correct lun
        mov     [edi].DSDiskNum,al             ;need this for request pop     edi
        pop     ebx
        pop     eax                            ;now ebx=ctrl# edi=ptr to tempdisk, eax=disk# * 2
        mov     byte ptr DriverID[0], bl       ;start setting up for adddiskdevice
        mov     al, [esi].ScanDriveNum         ;esi still pts to disk config
        mov     DriverID[1], al
        mov     eax, [ebp].HBACSCardNum
        mov     DriverID[2], al
        movzx   eax, [esi].ScanDriveHead       ;get total disk size
        mov     Heads, al
        mov     bl, [esi].ScanDriveSector
        mov     Sectors, bl
        mul     bl movzx   ebx, [esi].ScanDriveCylinder
        mov     Cylinders, bx
        mul     ebx
        mov     DiskSize, eax                  ;save total size AddThisDisk:
        push    MemRTag
        push    58
        call    Alloc                          ;acquisition B for this device
        lea     esp, [esp + 2*4]
        or      eax, eax
        jz      RegisterDiskError2
        mov     CurrentDiskName, eax
        push    esi
        push    edi
        lea     esi, [esi].ScanDriveNameLen
        mov     ecx, 29
        mov     edi, eax
        rep     movsw
        pop     edi
        pop     esi
        movzx   ebx, Cylinders
        shl     ebx, 16
        mov     bh, Heads
        mov     bl, Sectors
        mov     ecx, DiskSize
        push    SIZE HBADiskSpecificStructure  ;get ready to add disk
        push    ebp                            ;card handle
        push    dword ptr DriverID
        push    ebx                            ;device parameters
        mov     edx, 3
        shl     edx, 16
        push    edx                            ;driver info
        push    ecx                            ;total capacity
        push    OFFSET DriverIOPollRoutine
```

```
        push    CurrentDiskName
        call    AddDiskDevice              ;make actual call
        lea     esp, [esp + 8*4]
        or      eax, eax
        jz      RegisterDiskError2
        mov     edi, eax
        mov     esi, OFFSET TempDiskStruct
        mov     ecx, SIZE HBADiskSpecificStructure/2
        rep     movsw                      ;copy info to actual structure
        mov     edi, eax                   ;restore disk ptr
        mov     [edi].DSDiskActiveFlag, 1  ;flag disk active
        mov     [edi].DSCardHandle, ebp
        mov     eax, CurrentDiskName
        mov     [edi].DSDiskName, eax
        mov     [edi].DSVerifyMode,0       ;0=no verify, 1=hardware verify, 2=software verify
        mov     ebx, [ebp].HBACSDiskRoot
        mov     [edi].DSNextDisk, ebx
        mov     [ebp].HBACSDiskRoot, edi   ;put entry in disklist
        jmp     DriveAlreadyPresent RegisterDiskError2:
        pop     eax
        pop     esi
        pop     ebx
        pop     ebp
        btr     [ebp].HBACSDriveFlags, eax ;make sure invalid device is not marked active
        ret
DriveAlreadyPresent:
DriveIsInactive:
        pop     eax
        pop     esi
        pop     ebx
        pop     ebp
        ret RegisterThisDevice      endp ;**************************************************
;--> Routine # 8 - DeleteAndRemoveDeviceRoutine
;**************************************************
;       This is called by 3.X os to delete specific devices.
;       The driver should dequeue all requests at this point.
;       A fatal release means the hardware is not responding.
;
;       Device handle is passed on stack
;
;**************************************************

DeleteAndRemoveDeviceRoutine    proc    near cli
        CPush
        mov     edx, [esp + Parm0]         ;get device handle
```

```
            mov     ebp, [edx].DSCardHandle         ;get card handle
DDeleteWasFound:
            mov     eax, [edx].DSDeviceNum
            btr     [ebp].HBACSDriveFlags, eax      ;take device off active list
            call    DequeueRequests                 ;kill all requests
            push    2
            push    edx
            call    RemoveDiskDevice
            pop     edx
            lea     esp,[esp+1*4]
            push    edx
            call    DeleteDiskDevice
            pop     edx
            push    edx                             ;return mem for disk name
            push    [edx].DSDiskName
            call    Free                            ;return of acquisition B for this device
            lea     esp, [esp + 1*4]
            pop     edx DDeleteRemoveFromList:
            mov     ecx, [ebp].HBACSDiskRoot
            cmp     ecx, edx
            jnz     DDeleteNotListHead mov     ecx, [ecx].DSNextDisk
            mov     [ebp].HBACSDiskRoot, ecx
            jmp     DDeleteNotFound DDeleteNotListHead:
            cmp     edx, [ecx].DSNextDisk
            je      DDeleteDiskFound
            mov     ecx, [ecx].DSNextDisk
            jmp     short   DDeleteNotListHead DDeleteDiskFound:
            mov     eax, [edx].DSNextDisk
            mov     [ecx].DSNextDisk, eax DDeleteNotFound:
            CPop
            xor     eax, eax
            ret DeleteAndRemoveDeviceRoutine    endp ;*********************************************
;--> Routine # 9 - DriverIOCTLPollRoutine
;*********************************************
;       DriverIOCTLPollRoutine(
;               LONG ControllerHandle
;               IOCTLRequestStructure *IOCTLRequest)
;*********************************************

DriverIOCTLPollRoutine  proc    near
```

```
        cli
        CPush
        mov     ebp, [esp + Parm0]          ; get Cardhandle
        mov     ecx, [esp + Parm1]          ; get ptr to IOCTLRequest
        push    ecx                         ; save ptr to IOCTLRequest
        push    0
        push    ebp
        call    GetIOCTL
        lea     esp, [esp + 2*4]
        pop     ecx
        or      eax, eax
        jz      NoRequest
        mov     ecx, eax
        movzx   eax, byte ptr [ecx].IFunction  ; get function number
        push    ebp
        push    ecx
        call    DriverIOCTLPollRoutineJumpTable[eax * 4]    ; jump into IOCTL table
        pop     ecx                         ; retrieve ptr to IOCTLRequest
        pop     ebp
        jc      IOCTLReturnLater            ; if stc, don't call PutIOCTL mov     [ecx].ICompletionCode, ax   ; put ccode into IOCTLRequest
        push    ecx                         ; push ptr to IOCTLRequest
        push    ebp                         ; push ControllerHandle
        call    PutIOCTL                    ; return the IOCTLRequest
        add     esp, 8                      ; adjust stack pointer
        CPop
        ret
NoRequest:
        mov     [ecx].ICompletionCode, IOCTLNotSupported
        push    ecx
        push    ebp
        call    PutIOCTL
        lea     esp, [esp + 2*4]
IOCTLReturnLater:                           ; the IOCTL will call PutIOCTL
        CPop
        ret DriverIOCTLPollRoutine endp ;************************************
;--> Routine # 10 - IOCTL_Function0
;************************************
;
;
;       EBP has card handle
;       ECX has request handle
;
;************************************

IOCTL_Function0   proc   near
        mov     edx, [ecx].IFunctionParameter       ; get disk handle etc.
        cmp     [ecx].ISubFunction, 0               ; Activate a disk?
        je      ActivateTheDeviceSoNetWareCanUseIt  ; yes -- jump
```

```
        cmp     [ecx].ISubFunction, 1              ; deactivate a device?
        je      DeActivateTheDeviceSoNetWareCantUseIt cmp     [ecx].ISubFunction, 2              ;Format Device
        je      NoRoutineForThisIOCTLSubFunction   ;Format is not required on
this device
;;      je      FormatTheMediaOnTheSelectedDevice  ;optionally use this if
Format is required cmp     [ecx].ISubFunction, 3              ;Device Verify
        je      SetUpTheTypeOfReadAfterWriteVerifyOnTheDevice cmp     [ecx].ISubFunction, 4              ;Identify Status
        je      FlashTheLightToIdentifyWhichDeviceWeAreLookingAt cmp     [ecx].ISubFunction, 5              ;Return Bad Block
Information
        je      NoRoutineForThisIOCTLSubFunction cmp     [ecx].ISubFunction, 6              ;Return Device Status
        je      NoRoutineForThisIOCTLSubFunction cmp     [ecx].ISubFunction, 7              ;Logical Device Mount
        je      NoRoutineForThisIOCTLSubFunction cmp     [ecx].ISubFunction, 8              ;Logical Device Dismount
        je      NoRoutineForThisIOCTLSubFunction cmp     [ecx].ISubFunction, 9              ;Unlock Device Media
        je      NoRoutineForThisIOCTLSubFunction cmp     [ecx].ISubFunction, 10             ;Lock Device Media
        je      NoRoutineForThisIOCTLSubFunction cmp     [ecx].ISubFunction, 11             ;Eject Media
        je      NoRoutineForThisIOCTLSubFunction NoRoutineForThisIOCTLSubFunction:
        mov     eax, IOCTLNotSupported             ; otherwise return
        clc                                        ;
DriverIOCTLPollRoutine calls PutIOCTL
        ret
IOCTL_Function0    endp ; The following IOCTL Functions are reserved for special implementations
;************************************
; IOCTL_Function1
;************************************
IOCTL_Function1    proc    near
        ret
IOCTL_Function1    endp
;
;************************************
; IOCTL_Function2
```

```
;**************************************
IOCTL_Function2    proc    near
        ret
IOCTL_Function2    endp
;
;**************************************
; IOCTL_Function3
;**************************************
IOCTL_Function3    proc    near
        ret
IOCTL_Function3    endp
;
;**************************************
; IOCTL_Function4-63    is reserved by Novell for NOS
; IOCTL_Function64-255 is reserved for developers drivers
;**************************************

;**********************************
;--> Routine # 11 - InvalidIOCTL
;**********************************

InvalidIOCTL   proc    near
        mov     eax, IOCTLNotSupported      ; indicate not supported = -7
        clc                                  ; so DriverIOCTLPollRoutine returns request
        ret
InvalidIOCTL   endp ;********************************************************
;--> Routine #12 - ActivateTheDeviceSoNetWareCanUseIt
;********************************************************
;
;       EBP has card handle
;       ECX has request structure
;       EDX has disk handle
;
;********************************************************

ActivateTheDeviceSoNetWareCanUseIt      proc
        mov     eax, [edx].DSDeviceNum      ;get proper device #
        bts     [ebp].HBACSDriveFlags, eax  ;put disk on list
        xor     eax, eax
        clc                                  ; DriverIOCTLPollRoutine calls PutIOCTL
        ret
ActivateTheDeviceSoNetWareCanUseIt      endp ;********************************************************
;--> Routine #13 - DeActivateTheDeviceSoNetWareCantUseIt
;********************************************************
;       EBP has card handle
;       ECX has request structure
;       EDX has disk handle
;********************************************************

DeActivateTheDeviceSoNetWareCantUseIt proc
```

```
        mov     eax, [edx].DSDeviceNum          ;get proper device #
        btr     [ebp].HBACSDriveFlags, eax      ;take disk off list
        xor     eax, eax
        clc                                     ; DriverIOCTLPollRoutine calls PutIOCTL
        ret
DeActivateTheDeviceSoNetWareCantUseIt endp ;**********************************************************
;--> Routine #14 - FormatTheMediaOnTheSelectedDevice
;**********************************************************
;
FormatTheMediaOnTheSelectedDevice       proc
;;      xor     eax, eax
;;      clc                                     ;or stc depending on where PutIOCTL is done
;;      ret                                     ;Formatting SCSI devices is generally unnecessary
FormatTheMediaOnTheSelectedDevice       endp ;****************************************************************
;--> Routine #15 - SetUpTheTypeOfReadAfterWriteVerifyOnTheDevice
;****************************************************************
;       EBP has card handle
;       ECX has request structure
;       EDX has disk handle
;****************************************************************

SetUpTheTypeOfReadAfterWriteVerifyOnTheDevice   proc
        mov     esi, [ecx].IFunctionBuffer
        cmp     byte ptr [esi], 3               ;does the caller want current device verify mode
        jnz     SetVerifyMode                   ;no, then just change the verify mode ; return the status of the verify flag for this device
        mov     al, [edx].DSVerifyMode
        mov     byte ptr [esi], al
        xor     eax, eax
        clc
        ret SetVerifyMode:
        mov     al, byte ptr [esi]
        cmp     al, 2                           ;is it a legal verification mode
        ja      VerifyErrorNoChangeExit         ;no mov     [edx].DSVerifyMode, al          ;set the verify mode for the device VerifyErrorNoChangeExit:
        xor     eax, eax
        clc                                     ; DriverIOCTLPollRoutine calls PutIOCTL
        ret
SetUpTheTypeOfReadAfterWriteVerifyOnTheDevice   endp ;****************************************************************
;--> Routine #16 - FlashTheLightToIdentifyWhichDeviceWeAreLookingAt
;****************************************************************
;
```

```
;       EBP has card handle
;       ECX has request structure
;       EDX has disk handle
;
;****************************************************
;
FlashTheLightToIdentifyWhichDeviceWeAreLookingAt      proc xor     eax, eax
        clc
        ret FlashTheLightToIdentifyWhichDeviceWeAreLookingAt      endp ;*****************************************
;--> Routine # 17 - DriverIOPollRoutine
;*****************************************
;
;       DriverIOPollRoutine(
;               LONG DiskHandle,
;               IORequestStructure *IORequest)
;
;*****************************************
;
DriverIOPollRoutine     proc    near
        cli
        CPush
        mov     edx, [esp + Parm0]              ;get diskhandle
        mov     ebp, [edx].DSCardHandle         ;get cardhandle cmp     [edx].DSCurrentIOCTLRequest, 0
        jne     CurrentlyBusy
        cmp     [edx].DSCurrentIORequest1, 0    ;make sure disk doesn't already have request pending
        je      UseIchiban
        cmp     [edx].DSCurrentIORequest2, 0
        jne     CurrentlyBusy
        jmp     UseNumberTwo ;;      cmp     XXXX, 0                         ; are there any other priorities to delay processing a
request now
;;      jne     CurrentlyBusy                   ; i.e. devices being scanned or pending IOCTLs UseIchiban:
        push    0                               ; push 0 to get any request
        push    edx                             ; push ptr to DiskSpecificStructure
        call    GetRequest                      ; get IORequestStructure
        pop     edx
        add     esp, 4                          ; adjust stack pointer
        or      eax, eax                ; did we get a pointer?
        jz      NoRequestInQueue                ; no -- jump and return
        mov     ebx, eax                        ; ebx has ptr to request node
        mov     eax, [edx].DSDeviceNum
        bt      [ebp].HBACSDriveFlags, eax              ;is device still active
        jnc     InactiveDevice1                 ;no
```

```
RetryEntry1:
        and     [ebx].SFunction, 01h        ;strip off high order bits
        cmp     [ebx].SFunction, 0          ; is request a read request?
        jnz     DriverWrite1                ; no, it's a write -- jump DriverRead1:                                ; send read request to controller
        mov     edi,OFFSET RequestBlock1    ;get buffer and set it up
        call    SetupHBACommand mov     [edx].DSCurrentBuffer, edi      ;save HBA buffer in disk structure
        mov     [edx].DSCurrentIORequest1, ebx
        mov     [edi].DCurrentRequest, ebx
        call    GetCurrentTime
        mov     [edx].DSTimeOut1, eax       ;set time limit
        call    SendReadCommand
        xor     eax, eax
        CPop
        ret DriverWrite1:                               ; send write request to controller
        mov     edi,OFFSET RequestBlock1
        call    SetupHBACommand
        mov     [edx].DSCurrentBuffer, edi      ;save request buffer
        mov     [edx].DSCurrentIORequest1, ebx
        mov     [edi].DCurrentRequest, ebx
        call    GetCurrentTime
        mov     [edx].DSTimeOut1, eax       ;set time limit
        call    SendWriteCommand
        xor     eax, eax
        CPop
        ret NoRequestInQueue:
CurrentlyBusy:
        xor     eax, eax                    ;clear return code
        CPop
        ret InactiveDevice1:
        mov     [ebx].SCompletionCode, INACTIVEDEVICE
        push    ebx
        push    [ebx].SDiskHandle
        call    PutRequest
        pop     edx
        lea     esp, [esp + 1*4]
        mov     [edx].DSCurrentIORequest1, 0
        xor     eax, eax
        CPop
        ret UseNumberTwo:
        push    0                           ; push 0 to get any request
        push    edx                         ; push ptr to DiskSpecificStructure
        call    GetRequest                  ; get IORequestStructure
```

```
                pop     edx
                add     esp, 4                          ; adjust stack pointer
                or      eax, eax                        ; did we get a pointer?
                jz      NoRequestInQueue2               ; no -- jump and return
                mov     ebx, eax                        ; ebx has ptr to request node
                mov     eax, [edx].DSDeviceNum
                bt      [ebp].HBACSDriveFlags, eax      ;is device still active
                jnc     InactiveDevice2                 ;no
RetryEntry2:
                and     [ebx].SFunction, 01h            ;strip off high order bits
                cmp     [ebx].SFunction, 0              ; is request a read request?
                jnz     DriverWrite2                    ; no, it's a write -- jump DriverRead2:                                            ; send read request to controller
                mov     edi, OFFSET RequestBlock2
                call    SetupHBACommand mov     [edx].DSCurrentBuffer, edi      ;save HBA buffer in disk structure
                mov     [edx].DSCurrentIORequest2, ebx
                mov     [edi].DCurrentRequest, ebx
                call    GetCurrentTime
                mov     [edx].DSTimeOut2, eax           ;set time limit
                call    SendReadCommand
                xor     eax, eax
                CPop
                ret DriverWrite2:                                           ; send write request to controller
                mov     edi, OFFSET RequestBlock2
                call    SetupHBACommand
                mov     [edx].DSCurrentBuffer, edi      ;save request buffer
                mov     [edx].DSCurrentIORequest2, ebx
                mov     [edi].DCurrentRequest, ebx
                call    GetCurrentTime
                mov     [edx].DSTimeOut2, eax           ;set time limit
                call    SendWriteCommand
                xor     eax, eax
                CPop
                ret NoRequestInQueue2:
CurrentlyBusy2:
                xor     eax, eax                        ;clear return code
                CPop
                ret InactiveDevice2:
                mov     [ebx].SCompletionCode, INACTIVEDEVICE
                push    ebx
                push    [ebx].SDiskHandle
                call    PutRequest
                pop     edx
                lea     esp, [esp + 1*4]
                mov     [edx].DSCurrentIORequest2, 0
```

```
        xor     eax, eax
        CPop
        ret

DriverIOPollRoutine     endp

;*****************************
;--> Routine # 18 - DriverISR
;*****************************

DriverISR       proc    near
ISR0:
        cli                                     ;clear interrupts to CPU
        mov     ebp, HBACardList[0*4]
        jmp     DriverISRCommon ISR1:
        cli                                     ;clear interrupts to CPU
        mov     ebp, HBACardList[1*4]
        jmp     DriverISRCommon ISR2:
        cli                                     ;clear interrupts to CPU
        mov     ebp, HBACardList[2*4]
        jmp     DriverISRCommon ISR3:
        cli                                     ;clear interrupts to CPU
        mov     ebp, HBACardList[3*4]

DriverISRCommon:
        ;
        ;
        ; test here for valid or spurious interrupts from
        ; the card or system
        ;
        ;

mov     ecx,[ebp].HBACSIOConfig
        movzx   eax,[ecx].CInterrupt0
        push    eax                             ;get IRQlevel
        call    CDisableHardwareInterrupt       ;disable interrupt to PIC
        lea     esp, [esp + 1*4]
; pull in the interrrupt message call    InterruptsOff mov     ecx,8000
```

```
dummy: mov    eax,eax
       loop   dummy call   GetMessage                      ;return msg in edi
       jc     ISRTimeOutError cmp    edi,0
       je     NoCurrentCompletion
       mov    esi,[edi].DDiskHandle
; esi has disk handle, edi has request block mov    ebx,[edi].DCurrentRequest
       cmp    ebx,[esi].DSCurrentIORequest1
       je     DoneWithOne
       cmp    ebx,[esi].DSCurrentIORequest2
       jne    badnews
       mov    [esi].DSCurrentIORequest2, 0
       mov    [esi].DSTimeOut2,0
       jmp    foundReq
DoneWithOne:
       mov    [esi].DSCurrentIORequest1, 0
       mov    [esi].DSTimeOut1,0
foundReq:
       mov    [esi].DSCurrentBuffer, 0        ;clear out buffer entry
;      mov    [esi].DSTimeOut, 0              ;clear time limit
;      not worrying about this right now., none go over
       cmp    [edi].DCurrentIOCTL, 0
       jne    HandleIOCTL
MustBeIO:
       mov    ebx, [edi].DCurrentRequest      ;get actual request
       mov    edx, esi                        ;edx has disk handle
       movzx  eax, [edi].DCompletionCode      ;get status from hardware
       cmp    eax, 0                          ;was there any kind of error?
       jne    HandleIOError                   ;yes xor    eax, eax
       mov    [ebx].SCompletionCode, ax       ;post completion
       call   ReturnHBABuffer
       push   ebx
       push   [ebx].SDiskHandle
       call   PutRequest
       pop    edx
       lea    esp, [esp + 1*4]
DoneRequest:
       push   0
       push   edx
       call   DriverIOPollRoutine
       pop    edx
       lea    esp, [esp + 1*4]
;;;    jmp    ISRCompletion                   ; commented for showing flow
ISRCompletion:
       mov    edx, [ebp].HBACSPortAdr         ; Reset interrupt on the card
```

```
NoCurrentCompletion:
        call    InterruptsOn
        mov     ecx, [ebp].HBACSIOConfig
        movzx   eax, [ecx].CInterrupt0          ; get IRQlevel
        push    eax
        call    CEnableHardwareInterrupt        ; enable interrupt to PIC
        call    CDoEndOfInterrupt               ; EOI to PIC
        lea     esp, [esp + 1*4]
        ret HandleIOError:
        int     3
        call    ReturnHBABuffer
        test    ax, 8000h                       ;fatal error?
        jz      MediaError                      ;no
        mov     eax, [edx].DSDeviceNum
        btr     [ebp].HBACSDriveFlags, eax      ;clear disk                  ;device
        push    41h
failed delete it
        push    edx
        call    AlertDevice
        pop     edx
        lea     esp, [esp + 1*4]
        mov     [ebx].SCompletionCode, NONMEDIAERROR
        push    ebx
        push    [ebx].SDiskHandle
        call    PutRequest
        pop     edx
        lea     esp, [esp + 1*4]
; send deactivate message here, if necessary
        jmp     ISRCompletion                   ;no more for this guy
MediaError:
        int     3
        mov     [ebx].SCompletionCode, MEDIAERROR
        push    ebx
        push    [ebx].SDiskHandle
        call    PutRequest
        pop     edx
        lea     esp, [esp + 1*4]
;       mov     [edx].DSCurrentIORequest, 0
        jmp     DoneRequest                     ;this guy could keep going badnews:
        int     3
        jmp     ISRCompletion HandleIOCTL:
        int     3
        mov     ebx, [edi].DCurrentIOCTL
        mov     edx, esi
        movzx   eax, [edi].DCompletionCode      ;get completion status from hardware
        call    ReturnHBABuffer
```

```
        mov     [ebx].ICompletionCode, ax
        mov     [esi].DSIOCTLtoPost, ebx
        mov     [esi].DSCurrentIOCTLRequest, 0
        jmp     DoneRequest                     ;this guy can do i/o now ISRTimeOutError:
        int     3 push    1
        push    ebp
;       call    AlertSystem
        lea     esp,[esp +2*4]
        jmp     DoneRequest DriverISR       endp ;****************************************
;--> Routine # 19 - DriverTimeOutRoutine
;****************************************
;
;       This procedure is always called with interrupts enabled.
;
;****************************************

DriverTimeOutRoutine    proc    near

DriverTimeOutRoutine0:
        CPush
        cli
        mov     ebp, HBACardList[0*4]
        jmp     DriverTimeOutCommon DriverTimeOutRoutine1:
        CPush
        cli
        mov     ebp, HBACardList[1*4]
        jmp     DriverTimeOutCommon DriverTimeOutRoutine2:
        CPush
        cli
        mov     ebp, HBACardList[2*4]
        jmp     DriverTimeOutCommon DriverTimeOutRoutine3:
        CPush
        cli
        mov     ebp, HBACardList[3*4]

DriverTimeOutCommon:
        mov     esi, [ebp].HBACSDiskRoot
CheckTimeLoop:
        cmp     esi, 0
        je      TimeCheckDone
```

```
            cmp     [esi].DSIOCTLtoPost, 0          ;does disk have a completed IOCTL?
            je      CheckIOTime                     ;no
            mov     ebx, [esi].DSIOCTLtoPost        ;post IOCTL completion
            push    ebx
            push    ebp
            call    PutIOCTL
            lea     esp, [esp + 2*4]
            jmp     TimeNextDisk
CheckIOTime:
            cmp     [esi].DSCurrentIORequest1, 0    ;does disk have pending request?
            je      CheckIOTime2                    ; was TimeNextDisk                ;no
            call    GetCurrentTime
            mov     ecx, eax
            sub     ecx, [esi].DSTimeOut1
            cmp     ecx, TIMEOUTLIMIT               ;did request time out
            jle     CheckIOTime2                    ; was TimeNextDisk                ;no
            mov     edi, [esi].DSCurrentBuffer      ;device timed out. I don't need the buffer anymore.
            call    ReturnHBABuffer
            mov     edx, esi                        ;see if device is still alive
            jmp     DriveIsReallyDead1              ;don't keep retrying after this long
CheckIOTime2:
            cmp     [esi].DSCurrentIORequest2, 0    ;does disk have pending request?
            je      TimeNextDisk                    ;no
            call    GetCurrentTime
            mov     ecx, eax
            sub     ecx, [esi].DSTimeOut2
            cmp     ecx, TIMEOUTLIMIT               ;did request time out
            jle     TimeNextDisk                    ;no
            mov     edi, [esi].DSCurrentBuffer      ;device timed out. I don't need the buffer anymore.
            call    ReturnHBABuffer
            mov     edx, esi                        ;see if device is still alive
            jmp     DriveIsReallyDead2              ;don't keep retrying after this long
TimeNextDisk:
            mov     esi, [esi].DSNextDisk
            jmp     CheckTimeLoop
TimeCheckDone:
            push    [ebp].HBACSAESEvent
            call    ScheduleNoSleepAESProcessEvent
            lea     esp, [esp + 1*4]
            CPop
            ret DriveIsReallyDead1:                                 ;if device is dead post nonmedia error and delete disk
            mov     eax, [edx].DSDeviceNum
            btr     [ebp].HBACSDriveFlags, eax
            mov     ebx, [edx].DSCurrentIORequest1
            mov     [ebx].SCompletionCode, NONMEDIAERROR
            push    ebx
            push    edx
            call    PutRequest
            pop     edx
            lea     esp, [esp + 1*4]
            push    41h
            push    edx
```

```
                call    AlertDevice
                pop     edx
                lea     esp, [esp + 1*4]
                mov     [edx].DSCurrentIORequest1, 0
                mov     [edx].DSCurrentIOCTLRequest, 0
                jmp     CheckIOTime2              ;was timenextdisk DriveIsReallyDead2:                               ;if device is dead post nonmedia error and delete disk
                mov     eax, [edx].DSDeviceNum
                btr     [ebp].HBACSDriveFlags, eax
                mov     ebx, [edx].DSCurrentIORequest2
                mov     [ebx].SCompletionCode, NONMEDIAERROR
                push    ebx
                push    edx
                call    PutRequest
                pop     edx
                lea     esp, [esp + 1*4]
                push    41h
                push    edx
                call    AlertDevice
                pop     edx
                lea     esp, [esp + 1*4]
                mov     [edx].DSCurrentIORequest2, 0
                mov     [edx].DSCurrentIOCTLRequest, 0
                jmp     TimeNextDisk DriverTimeOutRoutine    endp ;**********************************************************************
; These are all support routines for command and buffer manipulation
;**********************************************************************

;*******************************
;--> Routine # 20 - GetHBABuffer
;*******************************
;
;       on entry: ebp contains cardhandle
;       on exit: edi contains ptr to buffer
;
;       other regs are preserved
;
;*******************************

GetHBABuffer    proc    near
;       mov     edi, OFFSET RequestBlock
        ret
GetHBABuffer    endp ;**************************************
;--> Routine # 21 - ReturnHBABuffer
;**************************************
;
;       on entry: ebp has cardhandle, edi has ptr to buffer to return.
;       on exit: nothing
```

```
;***********************************
RetumHBABuffer          proc    near
            ret
ReturnHBABuffer         endp ;***********************************
;--> Routine # 22 - SetupHBACommand
;***********************************
;
;       on entry: ebp=cardhandle, edi=HBAbuffer ptr, ebx=requesthandle, edx=diskhandle
;       on exit: HBABuffer is ready to send
;
;***********************************

SetupHBACommand         proc    near
        mov     al, [edx].DSDiskNum
        mov     ah, 0
        mov     [edi].DDiskNum,ax
        mov     al, [ebx].SFunction
        mov     [edi].DFunction, ax
        movzx   eax, [ebx].SNumberOfSectors
        mov     [edi].DNumberOfSectors, ax mov     eax, [ebx].SStartingSector
        mov     [edi].DStartingSectorLow, ax
        shr     eax, 16
        mov     [edi].DStartingSectorHigh, ax
        mov     eax,[ebx].SBufferAddress
        mov     [edi].DBufferAddress,eax ;       added by R Ohran to include sending diskhandle to tsp
        mov     [edi].DDiskHandle,edx xor     eax, eax
        ret
SetupHBACommand         endp ;***********************************
;--> Routine # 23 - SendHBACommand
;***********************************
;
;       on entry: ebp=cardhandle, ebx=request, edx=diskhandle, edi=HBAbuffer
;       on exit: HBA interface has command to process
;
;***********************************
SendWriteCommand        proc    near
        push    esi
        push    ebx
        push    edx
        push    ecx
        movzx   eax,[edi].DNumberOfSectors
        shl     eax,9
```

```
        push    eax
        add     eax, SIZE HBARequestBlock-4
        shl     eax,16
        mov     ah,4
        mov     al,0A5H
        call    PutWord              ;ebp=cardhandle,eax =data
        jc      WriteTimeOut
        mov     esi,edi
        add     esi,4
        mov     [edi].DResponseAddress,esi
        mov     ecx,SIZE HBARequestBlock-4
        call    PutBlock
        jc      WriteTimeOut
        mov     esi,[edi].DBufferAddress
        pop     ecx
        call    PutBlock
        jc      WriteTimeOut
        pop     ecx
        pop     edx
        pop     ebx
        pop     esi
        ret
WriteTimeOut:
        xor     eax,eax
        stc
        ret SendWriteCommand      endp SendReadCommand       proc    near
        push    esi
        push    ebx
        push    edx
        push    ecx
        mov     eax, SIZE HBARequestBlock-4    ;link to next request
        shl     eax,16
        mov     ah,3
        mov     al,0A5H
        call    PutWord              ;ebp=cardhandle,eax =data
        jc      ReadTimeOut
        mov     esi,edi
        add     esi,4
        mov     [edi].DResponseAddress,esi
        mov     ecx,SIZE HBARequestBlock-4
        call    PutBlock
        jc      ReadTimeOut
        pop     ecx
        pop     edx
        pop     ebx
        pop     esi
        ret
ReadTimeOut:
        xor     eax,eax
        stc
```

```
           ret
SendReadCommand      endp

;***********************************
;--> Routine #24 - DequeueRequests
;***********************************

DequeueRequests      proc    near
           pushad
RDequeueLoop:
           push    0
           push    edx
           call    GetRequest
           pop     edx
           lea     esp, [esp + 1*4]
           or      eax, eax
           jz      RDeleteNoMore
           mov     [eax].SCompletionCode, NONMEDIAERROR
           push    eax
           push    edx
           call    PutRequest
           pop     edx
           lea     esp, [esp + 1*4]
           jmp     short   RDequeueLoop
RDeleteNoMore:
           popad
           ret
DequeueRequests      endp ;*******************************************
;       Routine # 25 - GetMessageProc
;*******************************************

ReadResponseCode     EQU     3
WriteResponseCode    EQU     4
ScanResponseCode     EQU     2
ScanResetCode        EQU     1

GetMessage     proc    near          ;ebp = card handle
               call    GetWord       ;ebp has card handle, eax returns word
               cmp     al,0A5H
               jne     FormatError1
               mov     MessageCode,ah
               shr     eax,16
               mov     MessageCount,ax
               cmp     MessageCode,ScanResponseCode
               je      ScanResponse
               cmp     MessageCode,ScanResetCode
               je      ScanReset
               cmp     MessageCode,ReadResponseCode
               je      ReadResponse
               cmp     MessageCode,WriteResponseCode
               je      WriteResponse
               stc
```

```
                ret
FormatError1:
                int     3
                mov     ax,1
FormatError2:
                int     3
                mov     ax,2
FormatError3:
                int     3
                mov     ax,3
FormatError4:
                int     3
                mov     ax,4
FormatError5:
                int     3
                mov     ax,5
ScanResponse:
                movzx   ecx,MessageCount
                cmp     ecx,0
                je      FormatError2
                call    GetWord
                mov     edi,eax
                cmp     [edi],edi
                jne     FormatError3
                add     edi,4
                sub     ecx,4
ScanResponseLoop:
                call    GetWord
                jc      FormatError4
                mov     [edi],eax
                add     edi,4
                sub     ecx,4
                cmp     ecx,0
                jl      FormatError5
                jne     ScanResponseLoop
                mov     edi,0
                clc
                ret ScanReset:      mov     edi,0
                clc
                ret ReadResponse:

cmp     MessageCount,SIZE HBARequestBlock-4
                jl      ReadFormatError call    GetWord
                jc      ReadFormatError
                mov     edi,eax
                cmp     [edi],edi
                jne     ReadFormatError
                sub     edi,4                   ;set it to start of record
```

```
                call    GetWord
                jc      ReadFormatError
                cmp     [edi].DDiskHandle,eax
                jne     ReadFormatError call    GetWord
                jc      ReadFormatError
                cmp     [edi].DCurrentRequest,eax
                jne     ReadFormatError call    GetWord
                jc      ReadFormatError
                cmp     [edi].DCurrentIOCTL,eax
                jne     ReadFormatError call    GetWord
                jc      ReadFormatError
                mov     [edi].DCompletionCode,ax    ;toss function code call    GetWord
                jc      ReadFormatError
                cmp     DWORD PTR [edi].DDiskNum,eax    ;num sectors compared too
                jne     ReadFormatError call    GetWord
                jc      ReadFormatError
                cmp     DWORD PTR [edi].DStartingSectorLow,eax
                jne     ReadFormatError call    GetWord
                jc      ReadFormatError
                cmp     [edi].DBufferAddress,eax
                jne     ReadFormatError movzx   ecx,MessageCount
                sub     ecx,SIZE HBARequestBlock-4
                movzx   eax,[edi].DNumberOfSectors
                shl     eax,9
                cmp     ecx,eax
                jne     ReadFormatError push    edi
                mov     edi,[edi].DBufferAddress
                call    GetBlock            ;edi=dest adr,ecx =cnt
                pop     edi
                jc      ReadFormatError
                clc
                ret
WriteResponse:
                cmp     MessageCount,SIZE HBARequestBlock-4
                jl      ReadFormatError call    GetWord
```

```
            jc      ReadFormatError
            mov     edi,eax
            cmp     [edi],edi
            jne     ReadFormatError
            sub     edi,4 call    GetWord
            jc      ReadFormatError
            cmp     [edi].DDiskHandle,eax
            jne     ReadFormatError call    GetWord
            jc      ReadFormatError
            cmp     [edi].DCurrentRequest,eax
            jne     ReadFormatError call    GetWord
            jc      ReadFormatError
            cmp     [edi].DCurrentIOCTL,eax
            jne     ReadFormatError call    GetWord
            jc      ReadFormatError
            mov     [edi].DCompletionCode,ax    ;toss function code call    GetWord
            jc      ReadFormatError
            cmp     DWORD PTR [edi].DDiskNum,eax    ;num sectors compared too
            jne     ReadFormatError call    GetWord
            jc      ReadFormatError
            cmp     DWORD PTR [edi].DStartingSectorLow,eax
            jne     ReadFormatError call    GetWord
            jc      ReadFormatError
            cmp     [edi].DBufferAddress,eax
            jne     ReadFormatError movzx   ecx,MessageCount
            sub     ecx,SIZE HBARequestBlock-4
            jnz     ReadFormatError
            clc
            ret ReadFormatError:
FormatError:
            int     3
            stc
            ret
GetMessage  endp
```

```
;*******************************************
;-->     Routine # 26 - GetByteProc
;*******************************************
IN_OFF          EQU     0
OUT_OFF         EQU     1
ISTAT_OFF       EQU     2
OSTAT_OFF       EQU     3
IORDY_OFF       EQU     12H
IDEN_OFF        EQU     18
ODEN_OFF        EQU     19
RST_OFF                 EQU     16

GetByte         proc    near
;               ebp has card handle
;               clobber edx, eax
                mov     edx,[ebp].HBACSPortAdr
                add     edx,ISTAT_OFF
GetByteLoop1:
                in      al,dx
                test    al,1
                jnz     GetByteReady1
                jmp     GetByteLoop1
GetByteReady1:
                sub     edx,ISTAT_OFF
                in      al,dx
                ret
GetByte         endp ;*******************************************
;-->     Routine # 27 - GetWordProc
;*******************************************

GetWord         proc    near
;               ebp has card handle
;               clobber edx, eax
                mov     edx,[ebp].HBACSPortAdr
                add     edx,ISTAT_OFF
GetWordLoop1:
                in      al,dx
                test    al,1
                jnz     GetWordReady1
                jmp     GetWordLoop1
GetWordReady1:
                sub     edx,ISTAT_OFF
                in      al,dx
                mov     Byte0,al
                add     edx,ISTAT_OFF
GetWordLoop2:
                in      al,dx
                test    al,1
                jnz     GetWordReady2
                jmp     GetWordLoop2
GetWordReady2:
                sub     edx,ISTAT_OFF
```

```
                in      al,dx
                mov     Byte1,al
                add     edx,ISTAT_OFF
GetWordLoop3:
                in      al,dx
                test    al,1
                jnz     GetWordReady3
                jmp     GetWordLoop3
GetWordReady3:
                sub     edx,ISTAT_OFF
                in      al,dx
                mov     Byte2,al
                add     edx,ISTAT_OFF
GetWordLoop4:
                in      al,dx
                test    al,1
                jnz     GetWordReady4
                jmp     GetWordLoop4
GetWordReady4:
                sub     edx,ISTAT_OFF
                in      al,dx
                mov     Byte3,al
                mov     eax,DWORD PTR Byte0
                ret
GetWord         endp TimeOutCnt      EQU     400000H ;***********************************
;--> Routine # 28 - PutWordProc
;***********************************

PutWord         proc    near
;       ebp has card handle
;       eax has data
                push    ecx
                mov     ecx,TimeOutCnt
                mov     edx,[ebp].HBACSPortAdr
                add     edx,OSTAT_OFF
                mov     DWORD PTR Byte0,eax
PutWordLoop1:
                in      al,dx
                test    al,1
                jnz     PutWordReady1
                loop    PutWordLoop1
                jmp     FailedPutWord
PutWordReady1:
                mov     al,Byte0
                sub     edx,OSTAT_OFF-OUT_OFF
                out     dx,al
                add     edx,OSTAT_OFF-OUT_OFF
                mov     ecx,TimeOutCnt
PutWordLoop2:
                in      al,dx
```

```
                test    al,1
                jnz     PutWordReady2
                loop    PutWordLoop2
                jmp     FailedPutWord
PutWordReady2:
                mov     al,Byte1
                sub     edx,OSTAT_OFF-OUT_OFF
                out     dx,al
                add     edx,OSTAT_OFF-OUT_OFF
                mov     ecx,TimeOutCnt
PutWordLoop3:
                in      al,dx
                test    al,1
                jnz     PutWordReady3
                loop    PutWordLoop3
                jmp     FailedPutWord
PutWordReady3:
                mov     al,Byte2
                sub     edx,OSTAT_OFF-OUT_OFF
                out     dx,al
                add     edx,OSTAT_OFF-OUT_OFF
                mov     ecx,TimeOutCnt
PutWordLoop4:
                in      al,dx
                test    al,1
                jnz     PutWordReady4
                loop    PutWordLoop4
                jmp     FailedPutWord
PutWordReady4:
                mov     al,Byte3
                sub     edx,OSTAT_OFF-OUT_OFF
                out     dx,al
                clc
PutWordExit:    pop     ecx
                ret
FailedPutWord:
                mov     edx,[ebp].HBACSPortAdr
                call    InitAdapter
                stc
                jmp     PutWordExit
PutWord         endp ;***********************************
;-->     Routine # 29 - GetBlockProc
;***********************************

GetBlock        proc    near
; edi has the address where the block is supposed to go
; ecx has the byte count for the block
; edp has the card handle
; edx gets clobbered mov     edx,[ebp].HBACSPortAdr
                ADD     dx,IORDY_OFF
```

```
                mov     al,1
                out     dx,al
                inc     dx
                out     dx,al
                mov     al,2
                dec     dx
                sub     dx,IORDY_OFF
                add     dx,ISTAT_OFF
                out     dx,al
;               SUB     dx,ISTAT_OFF
;               add     dx,OSTAT_OFF
;               out     dx,al cld
                push    edi
                mov     edx,[ebp].HBACSPortAdr
                add     edx,ISTAT_OFF
GetBlockLoop:
                in      al,dx
                test    al,1
                jnz     GetBlockReady
                jmp     GetBlockLoop
GetBlockReady:
                sub     edx,ISTAT_OFF
                rep     insb ;               in      al,dx
;               stosb
;               add     edx,ISTAT_OFF
;               loop    GetBlockLoop mov     edx,[ebp].HBACSPortAdr
                ADD     dx,IORDY_OFF
                mov     al,0
                out     dx,al
                inc     dx
                out     dx,al
                mov     al,0
                dec     dx
                sub     dx,IORDY_OFF
                add     dx,ISTAT_OFF
                out     dx,al
;               SUB     dx,ISTAT_OFF
;               add     dx,OSTAT_OFF
;               out     dx,al pop     edi
                clc
                ret
GetBlock        endp
```

;************************************
;--> Routine # 30 - PutBlockProc
;************************************

```
PutBlock        proc    near
; esi has the block address
; ecx has the count of bytes to be sent
; ebp has the card handle
; edx gets clobbered cld
                push    esi
                mov     edx,[ebp].HBACSPortAdr
                add     edx,OSTAT_OFF
PutBlockLoop:
                in      al,dx
                test    al,1
                jnz     PutBlockReady
                jmp     PutBlockLoop
PutBlockReady:
                lodsb
;               inc     esi
                sub     edx,OSTAT_OFF-OUT_OFF
                out     dx,al
                add     edx,OSTAT_OFF-OUT_OFF
                loop    PutBlockLoop
                pop     esi
                clc
                ret
PutBlock        endp
```

;************************************
;--> Routine # 31 - InitAdapterProc
;************************************

```
InitAdapter     proc    near
;               mov     edx,[ebp].HBACSPortAdr
                xor     al,al
                add     dx,ISTAT_OFF
                out     dx,al           ; Disable adaptor interrupts (input)
                sub     dx,ISTAT_OFF
                add     dx,OSTAT_OFF
                out     dx,al           ; Disable adaptor interrupts (output)
                sub     dx,OSTAT_OFF
                add     dx,IDEN_OFF
                out     dx,al           ; Disable adaptor DMA (input)
                sub     dx,IDEN_OFF
                add     dx,ODEN_OFF
                out     dx,al           ; Disable adaptor DMA (output)
                sub     dx,ODEN_OFF ; reset the link
```

```
                add     dx,RST_OFF
                mov     al,1
                out     dx,al
                mov     eax,30000
ResetLoop:      dec     eax
                jnz     ResetLoop
                mov     al,0
                out     dx,al
                mov     eax,30000
ResetLoop1:     dec     eax
                jnz     ResetLoop1
                sub     dx,RST_OFF ;               mov     edx,[ebp].HBACSPortAdr
                add     edx,OSTAT_OFF
                in      al,dx
                and     al,0FDH
                out     dx,al
                sub     edx,OSTAT_OFF add     dx,ISTAT_OFF
                in      al,dx
                test    al,0FEH
                jz      init1
                mov     ax,0        ; Return 0 if not found
                jmp     SHORT init2
init1:
                mov     eax,1       ; Return 1 if found
init2:
                ret
InitAdapter             ENDP ;***********************************
;-->    Routine # 32 - InterruptsOnProc
;***********************************

InterruptsOn    proc    near
                mov     edx,[ebp].HBACSPortAdr
                out     dx,al
                add     edx,ISTAT_OFF
                in      al,dx
                or      al,2
                out     dx,al
                ret
InterruptsOn    endp ;***********************************
;-->    Routine # 33 - InterruptsOffProc
;***********************************

InterruptsOff   proc    near
                mov     edx,[ebp].HBACSPortAdr
```

```
                    add     edx,ISTAT_OFF
                    in      al,dx
                    and     al,0FDH
                    out     dx,al
                    ret
InterruptsOff       endp OSCODE              ends
            end
```

We claim:

1. A method for recovery from a file server failure in a network configuration comprising a first network server and a second network server interconnected by means for communicating between said first network server and said second network server, each of said first network server and said second network server comprising a file server operating system and at least one attached mass storage device, said method comprising the steps of:

executing on said first network server said file server operating system so that said first network server becomes operative to process file server requests that result in data being written to or read from the at least one mass storage device attached to said first network server;

executing on said first network server mass storage emulator program means for emulating a mass storage device so that said first network server appears to have, in addition to the at least one mass storage device attached to said first network server, at least one extra attached mass storage device that is accessed in the same manner as the at least one mass storage device attached to said first network server;

executing on said second network server mass storage access program means for communicating with said mass storage emulation program on said first network server over said means for communicating and for reading data from and writing data to said at least one mass storage device attached to said second network server;

said mass storage emulator program means receiving copies of mass storage requests sent to said at least one mass storage device attached to said first network server and said mass storage emulator program means sending said mass storage requests to said mass storage access program means via said means for communicating so that whenever said first network server writes data to the mass storage attached thereto, identical data is written to said mass storage emulator program;

said mass storage emulator program means sending received mass storage requests as commands over said means for communicating to said mass storage access program means; and said mass storage access program means receiving over said means for communicating said commands and processing said commands to write data to or read data from said at least one mass storage device attached to said second network server.

2. A method for recovery from failure of a network server as recited in claim 1 further comprising the steps of:

executing on said second network server said file server operating system so that said second network server becomes operative to process file server requests that result in data being written to or read from the at least one mass storage device attached to said second network server; and configuring said second network server to process different file server requests than said first network server so that a given file server request is only processed by one of either said first network server or said second network server.

3. A method for recovery from failure of a network server as recited in claim 2 further comprising the step of initiating data mirroring from said second network server to said first network server so that when a data write request is received by said second network server, data contained in the received data write request is written both to the at least one mass storage device attached to said second network server and to the at least one mass storage device attached to said first network server.

4. A method for recovery from failure of a network server as recited in claim 1 further comprising the steps of:

detecting failure of said first network server;

stopping said mass storage access program on said second network server; and executing said file server operating system on said second network server and transferring responsibility for processing file server requests that were previously processed by said first network server to said second network server so that said network configuration continues to operate and does not fail even though said first network server has failed.

5. A method for recovery from failure of a network server as recited in claim 1 wherein said mass storage access program comprises a cache of data so that when said mass storage access program receives, from said first network server via said means for communicating, a read command comprising a request for data, the requested data is retrieved from said cache if the requested data resides therein and from the at least one mass storage device attached to said second network server if the requested data does not reside in said cache.

6. A method for recovery from a file server failure in a network configuration comprising a first network server and a second network server interconnected by means for communicating between said first network server and said second network server, each of said first network server and said second network server comprising a mass storage device directly connected thereto said method comprising the steps of:

selecting at least one configuration of two system configurations such that (1) said first network server processes received file server requests and said second network server does not process received file server requests, and (2) said first network server and said second network server each processes different file server requests; and initiating data mirroring from said first network server to said second network server via said means for communicating so that when a data write request is received by said first network server, data contained in said write request is written both to the mass storage device of said first network server and to the mass storage device of said second network server without said second network server independently receiving a copy of said data write request from the source that initiated said data write request, and wherein said data mirroring step comprises the steps of:

executing on said first network server a mass storage emulation program means for emulating a mass storage device so that said first network server appears to have at least one extra mass storage device in addition to the mass storage device directly connected to said first network server; and executing on said second network server a mass storage access program means for communicating with said mass storage emulation program means on said first network server over said means for communicating and for writing data received over said means for communicating to the mass storage device connected to said second network server so that when data is written to said mass storage emulation program means on said first network server, the data is transferred from said mass storage emulation program means on said first network server to said second network server and written to the mass storage device connected thereto, and wherein said mass storage access program means is further adapted to return data to said mass storage emulation program means in response to a read command and said mass storage access program means comprises a cache of data so that when said mass storage access program means receives, from said first network server via said means for communicating, a read command comprising a request for data, the requested data is retrieved from said cache if the requested data resides therein and from the mass storage device attached to said second network server if the requested data does not reside in said cache.

7. A method for recovery from failure of a network server as recited in claim 6 wherein said first network server and said second network server arc configured to process different file server requests and the method further comprises the step of initiating data mirroring from said second network server to said first network server via said means for communicating so that when a data write request is received by said second network server, data contained in said write request is written both to the mass storage device attached to said second network server and to the mass storage device attached to said first network server.

8. A method for recovery from failure of a network server as recited in claim 7 further comprising the steps of:

detecting the failure of either the first network server or the second network server; and if said first network server has failed, then transferring responsibility for processing file server requests that were previously processed by said first network server to said second network server and exiting the method; and if said second network server has failed, then transferring responsibility for processing file server requests that were previously processed by said second network server to said first network server and exiting the method.

9. A method for recovery from failure of a network server as recited in claim 6 wherein if a read request is received by said first network server, the read request is filled by said first network server by performing at least the following steps:

initiating at least one lower level read command to retrieve data both from the mass storage device attached to said first network server and from the mass storage device attached to said second network server;

waiting for the first response to said at least one read command from one of either the mass storage device attached to said first network server or the mass storage device attached to said second network server; and returning the retrieved data as the result of the received read request.

10. A method for recovery from failure of a network server as recited in claim 9 wherein if the at least one lower level read command specifies that data is to be read from at least one special mass storage location, then when the second network server receives the at least one lower level read command, the second network server returns alternative data in response to said at least one read command and not the data stored in said at least one special mass storage location.

11. A method for recovery from failure of a network server in a network configuration comprising a first network server and a second network server interconnected by means for communicating between said first network server and said second network server, each of said first network server and said second network server being adapted to execute a file server operating system in order to process file server requests and each of said first network server and said second network server comprising at least one attached mass storage device, said method comprising the steps of:

initiating operation of said file server operating system on said first network server and said second network server so that said first network server and said second network server become operative to process different file server requests such that a given file server request is processed by only one of either said first network server or said second network server; and initiating data mirroring from said first network server to said second network server via said means for communicating so that when a data write request is received by said first network server data contained in said write request is written both to the at least one mass storage device attached to said first network server and to the at least one mass storage device attached to said second network server without said second network server independently receiving a copy of said data write request from the source that initiated said data write request, and wherein said data mirroring step comprises the steps of:

executing on said first network server a mass storage emulation program means for emulating a mass storage device so that said first network server appears to have at least one extra mass storage device in addition to the mass storage device directly connected to said first network server;

executing on said second network server a mass storage access program means for communicating with said mass storage emulation program means on said first network server over said means for communicating and for writing data received over said means for communicating to the mass storage device connected to said second network server so that when data is written to said mass storage emulation program means on said first network server, the data is transferred from said mass storage emulation program means on said first network server to said second network server and written to the mass storage device connected thereto, and wherein said mass storage access program means is further adapted to return data to said mass storage emulation program means in response to a read command and said mass storage access program means comprises a cache of data so that when said mass storage access program means receives, from said first network server via said means for communicating a read command comprising a request for data, the requested data is retrieved from said cache if the requested data resides therein and from the mass storage device attached to said second network server if the requested data does not reside in said cache; and if a read request is received by said first network server, filling the read request by said first network server by performing at least the following steps:

initiating at least one lower level read command to retrieve data both from the mass storage device attached to said first network server and from the mass storage device attached to said second network server;

waiting for the first response to said at least one read command from one of either the mass storage device attached to said first network server or the mass storage device attached to said second network server;

returning the retrieved data as the result of the received read request; and if the at least one lower level read command specifies that data is to be read from at least one special mass storage location, then when the second network server receives the at least one lower level read command, returning, by the second network server alternative data in response to said at least one read command and not the data stored in said at least one special mass storage location.

12. A method for recovery from failure of a network server as recited in claim 11 further comprising the step of initiating data mirroring from said second network server to said first network server via said means for communicating so that when a data write request is received by said second network server, data contained in said write request is written both to the at least one mass storage device attached to said second network server and to the at least one mass storage device attached to said first network server.

13. A method for recovery from failure of a network server as recited in claim 11 further comprising the steps of:

detecting the failure of either the first network server or the second network server; and if said first network server has failed, then transferring responsibility for processing file server requests that were previously processed by said first network server to said second network server and exiting the method; and if said second network server has failed, then transferring responsibility for processing file server requests that were previously processed by said second network server to said first network server and exiting the method.

14. A system for recovery from failure of a network server comprising:

a first network server comprising an attached mass storage device and a file server operating system, said first network server being adapted to process file server requests;

a second network server comprising an attached mass storage device and a file server operating system, said second network being adapted to function in at least one of two system configurations such that (1) said second network server does not process file server requests, and (2) said second network server processes different file server requests from said first network server so that a given file server request is processed by only one of either said first network server or said second network server;

means for communicating between said first network server and said second network server so that data can be exchanged over said means for communicating;

a mass storage emulation program executing on said first network server so that said first network server appears to have another mass storage device attached thereto in addition to said mass storage device attached to said first network server; and a mass storage access program executing on said second network server, said mass storage access program adapted to communicate with said mass storage emulation program on said first network server via said means for communicating and adapted to write data received over said means for communicating to the mass storage device attached to said second network server so that when data is written to said mass storage emulation program on said first network server in response to a write request, the data is transferred from said mass storage emulation program on said first network server to said second network server and written to the mass storage device attached thereto without said second network server independently receiving a copy of said write request from another source, wherein said mass storage access program being further adapted to return data to said mass storage emulation program in response to a read command, said mass storage access program means comprising a cache of data so that when said mass storage access program receives, from said first network server via said means for communicating a read command comprising a request for data, the requested data is retrieved from said cache if the requested data resides therein and from the mass storage device attached to said second network server if the requested data does not reside in said cache;

wherein the first network server carries computer-executable instructions that, when executed upon a read request being received by said first network server, perform the steps of:

initiating at least one lower level read command to retrieve data both from the mass storage device attached to said first network server and from the mass storage device attached to said second network server;

waiting for the first response to said at least one read command from one of either the mass storage device attached to said first network server or the mass storage device attached to said second network server;

returning the retrieved data as the result of the received read request; and if the at least one lower level read command specifies that data is to be read from at least one special mass storage location, then when the second network server receives the at least one lower level read command, returning, by the second network server, alternative data in response to said at least one read command and not the data stored in said at least one special mass storage location.

15. A system for recovery from failure of a network server as recited in claim 14 wherein said first network server and said second network server are connected to a common network.

16. A system for recovery from failure of a network server as recited in claim 14 further comprising means for automatically detecting failure of said first network server so that responsibility for processing file server requests can be transferred from said first network server to said second network server.

17. A system for recovery from failure of a network server as recited in claim 14 wherein said first network server is further adapted to receive mirroring data over said means for communicating and write said mirroring data to said at least one mass storage device attached to said first network server, thereby creating a system where file server requests processed by said first network server are mirrored from said first network server to said network server and where file server requests processed by said second network server are mirrored from said second network server to said first network server.

18. A system for recovery from failure of a network server as recited in claim 17 wherein each of said first network server and sad second network server further comprises means for automatically detecting the failure of a network server.

19. A system for recovery from failure of a network server comprising:

a first network server comprising an attached mass storage device and a file server operating system adapted to process a first set of file server requests;

a second network server comprising an attached mass storage device and a file server operating system adapted to process a second set of file server requests so that a given file server request is processed by only one of either said first network server or said second network server;

means for communicating between said first network server and said second network server so that data can be exchanged over said means for communicating;

a mass storage emulation program executing on said first network server so that said first network server appears to have another mass storage device attached thereto in addition to said mass storage device attached to said first network server; and a mass storage access program executing on said second network server, said mass storage access program adapted to communicate with said mass storage emulation program on said first network server via said means for communicating and adapted to write data received over said means for communicating to the mass storage device attached to said second network server so that when data is written to said mass storage emulation program on said first network server in response to a write request, the data is transferred from said mass storage emulation program on said first network server to said second network server and written to the mass storage device attached thereto without said second network server independently receiving a copy of said write request from another source, said mass storage access program being further adapted to return data to said mass storage emulation program in response to a read command, said mass storage access program comprising a cache of data so that when said mass storage access program receives from said first network server via said means for communicating a read command comprising a request for data, the requested data is retrieved from said cache if the requested data resides therein and from the mass storage device attached to said second network server if the requested data does not reside in said cache;

wherein the first network server carries computer-executable instructions that, when executed upon a read request being received by said first network server, perform the steps of:

initiating at least one lower level read command to retrieve data both from the mass storage device attached to said first network server and from the mass storage device attached to said second network server;

waiting for the first response to said at least one read command from one of either the mass storage device attached to said first network server or the mass storage device attached to said second network server;

returning the retrieved data as the result of the received read request; and if the at least one lower level read command specifies that data is to be read from at least one special mass storage location, then when the second network server receives the at least one lower level read command, returning, by the second network server, alternative data in response to said at least one read command and not the data stored in said at least one special mass storage location.

20. A system for recovery from failure of a network server as recited in claim 19 wherein said first network server and said second network server comprise different hardware configurations.

21. A computer-readable medium having executable instructions encoded thereon for use by a network configuration comprising a first network server and a second network server interconnected by a means for communicating between said first network server and said second network server, each of said first network server and said second network server comprising an attached mass storage device, said executable instructions comprising:

a mass storage emulation program means for emulating a mass storage device when loaded onto said first network server, said mass storage emulation program means being adapted to communicate with said second network server over said means for communicating in order to read data from or write data to the mass storage device attached to said second network server without said second network server independently receiving write requests from another source, said first network server appearing to have at least one extra mass storage device in addition to the mass storage device directly attached to said first network server;

a mass storage emulator program means for emulating a mass storage device so that said first network server appears to have at least one extra mass storage device in addition to the mass storage device directly connected to said first network server; and a mass storage access program means for communicating with said mass storage emulation program means on said first network server over said means for communicating when said mass storage access program means, is loaded onto said second network server said mass storage access program means being adapted to write data received over said means for communicating to the mass storage device connected to said second network server so that when data is written to said mass storage emulation program means on said first network server, the data is transferred from said mass storage emulation program means on said first network server to said second network server and written to the mass storage device connected thereto, and wherein said mass storage access program means is further adapted to return data to said mass storage emulation program means in response to a read command and said mass storage access program means being associated with a cache of data so that when said mass storage access program means receives, from said first network server via said means for communicating, a read command comprising a request for data, the requested data is retrieved from said cache if the requested data resides therein and from the mass storage device attached to said second network server if the requested data does not reside in said cache;

read request program means for filling a read request received by said first network server when said read request program means is loaded onto said first network server, said read request program means being adapted to perform at least the following steps:

initiating at least one lower level read command to retrieve data both from the mass storage device attached to said first network server and from the mass storage device attached to said second network server;

waiting for the first response to said at least one read command from one of either the mass storage device attached to said first network server or the mass storage device attached to said second network server;

returning the retrieved data as the result of the received read request; and if the at least one lower level read command specifies that data is to be read from at least one special mass storage location, then when the second network server receives the at least one lower level read command, returning by the second network server, alternative data in response to said at least one read command and not the data stored in said at least one special mass storage location; and means for automatically detecting failure of said first network server in order to transfer responsibility from processing server requests from said first network server to said second network server.

22. A method for recovery from a file server failure in a network configuration comprising a first network server and a second network server interconnected by means for communicating between said first network server and said second network server, each of said first network server and said second network server comprising a mass storage device directly connected thereto, said method comprising the steps of:

selecting at least one configuration of two system configurations such that (1) said first network server processes received file server requests and said second network server does not process received file server requests, and (2) said first network server and said second network server each process different file server requests; and initiating data mirroring from said first network server to said second network server via said means for communicating so that when a data write request is received by said first network server, data contained in said write request is written both to the mass storage device of said first network server and to the mass storage device of said second network server, wherein said initiating data mirroring step is accomplished by performing at least the steps of:

executing on said first network server a mass storage emulator program means for emulating a mass storage device so that said first network server appears to have at least one extra mass storage device in addition to the mass storage device directly connected to said first network server; and executing on said second network server a mass storage access program means for communicating with said mass storage emulation program means on said first network server over said means for communicating and for writing data received over said means for communicating to the mass storage device connected to said second network server so that when data is written to said mass storage emulation program means on said first network server, the data is transferred from said mass storage initiation program means on said first network server to said second network server and written to the mass storage device connected thereto, wherein said mass storage access program means is further adapted to return data to said mass storage emulation program means in response to a read command and wherein said mass storage access program means comprises a cache of data so that when said mass storage access program means receives, from said first network server via said means for communicating, a read command comprising a request for data, the requested data is retrieved from said cache if the requested data resides therein and from the mass storage device attached to said second network server if the requested data does not reside in said cache.

23. A method for recovery from failure of a network server as recited in claim 22 wherein if a read request is received by said first network server, the read request is filled by said first network server by performing at least the following steps:

initiating at least one lower level read command to retrieve data both from the mass storage device attached to said first network server and from the mass storage device attached to said second network server;

waiting for the first response to said at least one read command from one of either the mass storage device attached to said first network server or the mass storage device attached to said second network server; and returning the retrieved data as the result of the received read request.

24. A method for recovery from failure of a network server as recited in claim 23, wherein if the at least one lower level read command specifies that data is to be read from at least one special mass storage location, then when the second network server receives the at least one lower level read command, the second network server returns alternative data in response to said at least one read command and not the data stored in said at least one special mass storage location.

25. A method for recovery from failure of a network server in a network configuration comprising a first network server and a second network server interconnected by means for communicating between said first network server and said second network server, each of said first network server and said second network server being adapted to execute a file server operating system in order to process file server requests and each of said first network server and said second network server comprising at least one attached mass storage device, said method comprising the steps of initiating operation of said file server operating system on said first network server and said second network server so that said first network server and said second network server become operative to process different file server requests such that a given file server request is processed by only one of either said first network server or said second network server; and initiating data mirroring from said first network server to said second network server via said means for communicating so that when a data write request is received by said first network server, data contained in said write request is written both to the at least one mass storage device attached to said first network server and to the at least one mass storage device attached to said second network server, wherein said initiating data mirroring step is accomplished by performing at least the steps of:

executing on said first network server a mass storage emulator program means for emulating a mass storage device so that said first network server appears to have at least one extra mass storage device in addition to the at least one mass storage device attached to said first network server; and executing on said second network server a mass storage access program means for communicating with said mass storage emulation program means on said first network server over said means for communicating and for writing data received over said means for communicating to the at least one mass storage device attached to said second network server so that when data is written to said mass storage emulation program means on said first network server, the data is transferred from said mass storage emulation program means on said first network server to said second network server and written to the at least one mass storage device attached thereto, wherein said mass storage access program means is further adapted to return data to said mass storage emulation program means in response to a read command and wherein said mass storage access program means comprises a cache of data so that when said mass storage access program means receives, from said first network server via said means for communicating, a read command comprising a request for data, the requested data is retrieved from said cache if the requested data resides therein and from the mass storage device attached to said second network server if the requested data does not reside in said cache.

* * * * *

UNITED STATES PATENT AND TRADEMARK OFFICE
CERTIFICATE OF CORRECTION

PATENT NO. : 5,978,565
DATED : November 2, 1999
INVENTOR(S) : Michael R. Ohran, Richard S. Ohran, David Green, John M. Winger It is certified that error appears in the above-identified patent and that said Letters Patent are hereby corrected as shown below:

Cover Page, rt col. ln 4: after "Diverting" change "Date" to --Data--

Col. 1, ln. 16: after "Jul. 20, 1993," delete [now abandoned]

Col. 1, ln. 55: before "the increased" insert --to--

Col. 2, ln. 25: after "computer" change "become" to --becomes--

Col. 147, ln. 20: after "network server" change "arc" to --are--

Col. 151, ln. 3: after "server and" change "sad" to --said--

Col. 153, ln. 64: after "mass storage" change "initiation" to --emulation--

Signed and Sealed this

Third Day of April, 2001

Attest:

NICHOLAS P. GODICI

*Attesting Officer*    Acting Director of the United States Patent and Trademark Office